United States Patent
Arahira

(10) Patent No.: US 7,508,852 B2
(45) Date of Patent: Mar. 24, 2009

(54) PASSIVE MODE-LOCKED SEMICONDUCTOR LASER DIODE, AND OPTICAL CLOCK SIGNAL EXTRACTING DEVICE

(75) Inventor: Shin Arahira, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/637,926

(22) Filed: Dec. 13, 2006

(65) Prior Publication Data

US 2007/0134002 A1 Jun. 14, 2007

(30) Foreign Application Priority Data

Dec. 14, 2005 (JP) ............................. 2005-360257

(51) Int. Cl.
*H01S 3/10* (2006.01)
*H01S 3/098* (2006.01)

(52) U.S. Cl. .......................................... 372/26; 372/18

(58) Field of Classification Search .................... 372/18, 372/236
See application file for complete search history.

(56) References Cited

U.S. PATENT DOCUMENTS

| | | | | |
|---|---|---|---|---|
| 6,031,851 | A * | 2/2000 | Shimizu et al. | 372/18 |
| 6,542,522 | B1 * | 4/2003 | Arahira | 372/18 |
| 6,954,559 | B2 * | 10/2005 | Arahira | 385/11 |
| 2002/0031153 | A1 * | 3/2002 | Niwa et al. | 372/45 |
| 2006/0023757 | A1 * | 2/2006 | Mooradian et al. | 372/18 |

FOREIGN PATENT DOCUMENTS

JP 11-326974 11/1999

(Continued)

OTHER PUBLICATIONS

T. Ono et al., "Optical Clock Extraction from 10-Gbit/s Data Pulses by Using Monolithic Mode-Locked Laser Diodes", OFC'95, Technical Digest, THL4.

(Continued)

*Primary Examiner*—Minsun Oh Harvey
*Assistant Examiner*—Patrick Stafford
(74) *Attorney, Agent, or Firm*—Venable LLP; James R. Burdett

(57) ABSTRACT

To provide an optical clock signal extracting device with a simple configuration, by which an optical clock signal may be extracted without depending on the polarization direction of an input optical signal. A current is injected to a gain region 30 through an n-type common electrode 12 and a p-type electrode 24 in the gain region 30 by a constant current source 28. A reverse-bias voltage is applied by a constant voltage source 26 to a saturable absorption region 32 through the p-type electrode 12 and the n-type common electrode 72 in the saturable absorption region 32. An optical waveguide 16 in the gain region is formed with bulk crystal or a quantum well structure into which extension strain is introduced, and an optical waveguide 18 in the saturable absorption region is formed with a quantum well structure into which extension strain is introduced. Moreover, in the gain region, an optical gain for the TE mode is configured to be larger than that for the TM mode, and, in the saturable absorption region, absorption saturation energy for the TM mode is configured to be smaller than absorption saturation energy for the TE mode.

15 Claims, 13 Drawing Sheets

FOREIGN PATENT DOCUMENTS

| | | |
|---|---|---|
| JP | 2001-094199 | 4/2001 |
| JP | 3510247 | 9/2004 |
| WO | WO-93/22855 | 11/1993 |

OTHER PUBLICATIONS

M. Jinno et al., "All-Optical Timing Extraction Using a 1.5 μm Self Pulsating Mutielectrode DFB LD", Electron, Lett., vol. 24(23).pp. 1426-1427, 1988.

Y. Hashimoto et al., "Optical Clock Recovery Using Optical Phase Locked Loop With Voltage-Controlled Mode-Locked Semiconductor Laser", ECOC 2004, vol. 3, paper We2.5.1.

F. Devaux et al., "10 Gbit/s Operation of Polarization Insensitive, Strained InGaAsP/InGaAsPMQW Electroabsorption Modulator", Electron, Lett., vol. 29(13), pp. 1201-1203 (1993).

* cited by examiner

AGREEMENT

NO AGREEMENT

PASSIVE MODE-LOCKED SEMICONDUCTOR LASER DIODE, AND OPTICAL CLOCK SIGNAL EXTRACTING DEVICE

BACKGROUND OF THE INVENTION

1. Field of the Invention

The present invention relates to a passive mode-locked semiconductor laser diode, and an optical clock signal extracting device using the diode.

2. Description of Related Art

In an optical communication network, longer-distance and larger-capacity transmission has been developed. Along with development of the longer-distance transmission, optical losses on an optical transmission line, reduction in signal-to-noise ratio, wherein the reduction is caused by use of multi-stage optical amplifier, the group velocity dispersion of an optical fiber, and generation of a waveform strain depending on nonlinear optical-effects in the optical fiber have raised a problem that the quality of an optical signal is deteriorated. The larger transmission capacity has caused distortion generation of frequency and time-pulse waveforms to become a more remarkable problem.

Therefore, there have been provided repeaters at intervals of from several tens to a few hundred kilometers in the middle of the optical transmission line. In these repeaters, the frequency and time-pulse waveforms of an optical signal have been returned to the original shape, that is, so-called reproduction of the optical signal has been performed. One of main roles of these repeaters is extraction of a clock signal. Extraction of a clock signal is to generate a signal an optical pulse train in which a series of optical pulses are arranged on a time axis with a frequency corresponding to that of the bit rate, or a radio frequency (RF) signal, which is a sinusoidal electric signal, from an optical signal including optical pulses with strained time-pulse waveforms, that is, an optical signal which has so-called deteriorated quality.

The clock signal is, extracted as an electric signal in some cases, and as an optical signal in other cases. Hereinafter, as long as it is required to clearly specify which way is used for extraction, an electric clock signal and an optical clock signal are distinguished from each other in writing. Moreover, a frequency corresponding to a bit rate of an optical signal is assumed to indicate a frequency of f GHz when the bit rate of the optical signal is f Gbit/s. Hereinafter, the frequency corresponding to the bit rate of an optical signal is called a bit-rate frequency in some cases.

One of general techniques which have been known as a method by which clock signal is extracted is a method according to which an optical signal with deteriorated quality is configured to be input to a photodiode, and the like for photoelectric conversion, and an electric output signal from the photodiode is filtered by a bandpass filter for extraction of only frequency elements corresponding to the bit rate of the input optical signal. Hereinafter, an optical signal, including an optical signal with deteriorated quality, from which a clock signal is extracted is assumed to be called an input optical signal.

An optical pulse train, in which a series of optical pulses are arranged on a time axis with a period, as a repetition frequency, corresponding to the bit-rate frequency of an input optical signal, is generated by activating an optical pulsed laser diode such as a semiconductor laser, using an electric clock signal generated through a photodiode and a bandpass filter. Hereinafter, an optical signal is assumed to be a signal which is generated as a return-to-zero (RZ) signal by optical modulation of a train of optical pulses which are regularly arranged on a time axis at constant periodic intervals, wherein the RZ signal is a binary digital signal which is a send signal. On the other hand, the optical pulse train is assumed to indicate an integrated whole of optical pulses which are regularly arranged on a time axis at constant periodic intervals.

Generally, a clock signal may be stably extracted by using the photodiode even if there are time fluctuations on the plane of polarization of an input optical signal as the photoelectric conversion characteristics of the photodiode has reduced polarization dependence.

On the other hand, multiple transmission technologies such as optical time division multiplexing have been researched as a technology to increase the transmission capacity of an optical communication network. The bit rate of a multiple signal becomes very large because the bit rate of the multiple signal is equal to a result obtained by multiplying the bit rate per one channel among multiple ones by a factor of a number of channels.

When the bit rate of the multiple signal exceeds 40 Gbit/s, it becomes difficult for an electronic device to extract an clock signal. The reason is that a photodiode applicable even for an optical signal with a bit rate which is 40 Gbit/s or more, and an electric narrow-band filter applicable even for an electrical signal with a frequency of 40 Gbit/s or more have not been developed so far.

Conventionally, a first method through a fifth one, which will be explained later, have been examined in order to extract a clock signal from a high-speed, optical signal. That is, there have been examined methods by which an optical clock signal is extracted directly from an input optical signal without requiring a step at which photoelectric conversion of the input optical signal is performed, using a photodiode and the like.

The first method is a method (refer to, for example, Japanese Patent Publication No. 3510247 (corresponding to WO93/022855)) using a fiber-type passive mode-locked laser. In this method, an optical pulse signal is extracted by inputting an input optical signal according to repetition with near the bit-rate frequency of the input optical signal to the fiber-type passive mode-locked laser which generates optical pulses, and by synchronizing the generation frequency of the optical pulses by the fiber-type passive mode-locked laser and the bit-rate frequency of the input optical signal.

Though the second method (refer to, for example, T. Ono, T. Shimizu, Y. Yano, and H. Yokoyama, "Optical clock extraction from 10-Gbit/s data pulses by using monolithic mode-locked laser diodes", OFC' 95 Technical Digest, ThL4) has a similar configuration to that of the above-described first method, a passive mode-locked semiconductor laser diode, instead of the fiber-type passive mode-locked laser, is used in the second method. In the second method, an optical pulse train, in which a series of optical pulses are arranged at time intervals equal to the bit-rate frequency of an input optical signal, is generated by synchronizing orbiting optical pulses in the passive mode-locked laser and an optical pulse forming the input optical signal, based on modulation of an optical absorption coefficient in a saturable absorption region. The optical pulse train is an optical clock signal which has been extracted The third method (refer to, for example, Japanese Patent Laid-Open Publication No. H11-326974) has a similar configuration to that of the above-described second method, and a passive mode-locked semiconductor laser diode is also used in the third method. However, the feature of the third method is that the passive mode-locked semiconductor laser diode is configured to include a coupling optical system such as a semiconductor optical amplifier, tunable filter, and lenses, and is a so-called external-cavity laser. Accordingly, the length of the resonator and the center wavelength of the tunable filter may be easily changed to bring about advantages that a frequency range in which optical clock signals may be extracted is wide, and the wavelengths of the extracted optical clock signals may be easily changed.

The fourth method (refer to, for example, Japanese Patent Laid-Open Publication No. 2001-94199) has a similar configuration to those of the above-described second and third methods, and a passive mode-locked semiconductor laser diode is also used in the fourth method. However, the feature of the fourth method is that there are used two passive mode-locked semiconductor laser diodes, that is, a first passive mode-locked semiconductor laser diode, and a second one. The first passive mode-locked semiconductor laser diode operates at a frequency near the bit-rate frequency of an input optical signal, and the second one operates at a frequency near a frequency which is an integral submultiple of the bit-rate frequency of an input optical signal. As the two passive mode-locked semiconductor laser diodes with different operating frequencies from each other are configured to be used as described above, it is possible to generate a frequency-divided optical clock signal with a frequency which is an integral submultiple of the bit-rate frequency of an input optical signal. Moreover, as a return-loop optical path is formed in the second passive mode-locked semiconductor laser diode, using an optical gate element, it is realized in the fourth method to generate a frequency-divided clock signal in a stable manner The fifth method (refer to, for example, M. Jinno and T. Matsumoto, "All-optical timing extraction using a 1.5 µm self pulsating multielectrode DFB LD", Electron, Lett., vol. 24, No. 23, pp. 1426-1427, 1988) is a method in which an optical pulse signal is extracted, using a self pulsating multielectrode distributed feed-back laser diode. An optical pulse signal is extracted by synchronizing an optical-pulse frequency generated from the self pulsating multielectrode distributed feed-back laser diode and the bit-rate frequency of the input optical signal after the bit-rate frequency of an input optical signal and the input optical signal are input to the self pulsating multielectrode distributed feed-back laser diode.

However, there is caused a problem, in the above-described first through fifth methods, that extracting operation of an optical clock signal strongly depends on the plane of polarization of the input optical signal. As an optical fiber before reaching an optical repeater is not processed in such a way that the plane of polarization of an input optical signal, which is propagating, is kept constant, the plane of polarization of the input optical signal generally causes time fluctuation. That is, the extracting operation of the optical clock signal becomes unstable by the time fluctuation of the plane of polarization of the input optical signal.

In the above-described first through fifth methods, there will be illustrated as follows a reason that the extracting operation of the optical clock signal strongly depends on the plane of polarization of the input optical signal.

An electro-optical Kerr effect is used in the first method, and the Kerr effect has a strong dependence on the plane of polarization. That is, though a direction on the plane of polarization of an optical pulse forming an optical clock signal existing in the inside of a fiber-type mode-locked laser and the direction on the plane of polarization of an input optical signal are in parallel with each other in some cases, and are orthogonal to each other in other cases, a coefficient of an electro-optical Kerr effect obtained in the parallel case is three times a coefficient in the orthogonal case. Accordingly, when the direction of the plane of polarization of the input optical signal is in accordance with that of the plane of polarization of oscillation light by a fiber-type mode-locked laser, an optical clock signal is extracted with a high efficiency. However, when the both directions of the planes of polarization are orthogonal to each other, there is caused a situation in which no optical clock signal is extracted.

The gain region of the passive mode-locked semiconductor laser diode, which is used in the second through the fifth methods, is realized by a bulk crystal layer, a quantum well layer, or a strained quantum well layer. Moreover, the saturable absorption region is realized by the quantum well layer or the strained quantum well layer. The reason will be described as follows.

That is, the reason is that it is easy to stabilize the mode-locking operation because absorption saturation energy may be reduced by a configuration in which the saturable absorption region includes the quantum well layer or the strained quantum well layer. Moreover, the reason is that a phenomenon in which high-speed saturable absorption occurs may be realized, which is preferable for extraction of an optical clock signal with a high bit-rate frequency.

The optical properties of the quantum well layer has a strong dependence on polarization. Especially, the strained quantum well layer into which no strain or compressive strain is introduced has characteristics such as a high optical gain, a large differential gain, a low α parameter, or low absorption saturation energy for polarization (so-called transverse electric wave (TE) polarization) parallel to the laminated surface of the quantum well. Accordingly, when an optical clock signal is extracted, using the passive mode-locked semiconductor laser diode in which the quantum well layer is adopted into the gain region and the saturable absorption region, the following preferable effects may be expected.

That is, when the plane of polarization of an input optical signal is TE polarization, the input optical signal is amplified with a high efficiency by optical amplification in the gain region. Moreover, as the absorption saturation energy is low in the saturable absorption region, there may be realized the larger modulation factor of an optical absorption coefficient in a saturable absorption region generated by the absorption saturation induced by the input optical signal. Thereby, even when the intensity of the input optical signal is low, a required modulation factor of the optical absorption coefficient in the saturable absorption region for extraction of the optical clock signal may be easily realized. That is, even when the intensity of the input optical signal is low, the optical clock signal may be extracted in a stable manner. Here, the modulation factor of the optical absorption coefficient is a change in the optical absorption coefficient, that is, a ratio between the minimum value and the maximum one of the optical absorption coefficient. The large modulation factor means that the degree of change in the optical absorption coefficient is large.

One the other hand, when the plane of polarization of the input optical signal is TE polarization, and when the plane is orthogonal polarization (so-called transverse magnetic wave TM polarization), the effect of optical amplification is not obtained in the gain region, and, moreover, the absorption saturation energy of the saturable absorption region is high. Accordingly, a required degree of modulation of the optical absorption coefficient in the saturable absorption region for extraction of the optical clock signal may not be realized. That is, when the optical clock signal is extracted from the input optical signal, there is a problem that there is generated the dependence on the plane of polarization of the input optical signal, that is, the optical clock signal is extracted in a stable manner when the input optical signal is TE polarization, and the optical clock signal may not be extracted in the case of the TM polarization.

There is no guarantee that the input optical signal is kept in the TE polarization because the optical fiber before reaching an optical repeater is not processed as described above in such a way that the plane of polarization of the input optical signal, which is propagating, is kept constant, and extraction of the optical clock signal depends on the plane of polarization of the input optical signal. That is, it is meant that the optical clock signal may not be extracted in a stable manner.

Then, a sixth and a seventh methods (refer to, for example, Japanese Patent Laid-Open Publication No. 2004-363873 (corresponding to U.S. Pat. No. 6,954,559) and Y. Hashimoto, R. Kuribayashi, S. Nakamura, and I. Ogura, "Optical clock recovery using optical phase-locked loop with voltage-controlled mode-locked semiconductor laser," ECOC 2004, Vol. 3, paper We2.5.1.) have been examined in order to solve the problem related with the dependence on the plane of polarization of the input optical signal.

In the sixth method, the input optical signal is separated in the first place into a polarization element (called a TE polarization element) in accordance with the plane of polarization of oscillation light by the mode-locked semiconductor laser diode and an element (called a TM polarization element) having the plane of polarization orthogonal to the plane of polarization by the oscillation light. The TE polarization element is input to one end surface of the resonator in the mode-locked semiconductor laser, keeping the polarization state. The TM polarization element is input to the other end surface of the resonator in the mode-locked semiconductor laser after the polarization state is rotated by 90 degrees and the element is made in accordance with the plane of polarization of oscillation light by the mode-locked semiconductor laser diode. The optical clock signal is extracted by the above-described method without depending on the plane of polarization of the input optical signal.

In the seventh method, the optical clock signal is extracted, using a semiconductor optical amplifier (SOA) as a phase comparator. As SOA functioning without depending on the plane of polarization is used, the optical clock signal is extracted without depending on the plane of polarization of the input optical signal.

However, a device, which is provided with a number of components such as a polarization synthetic separation circuit, an optical delay device, a specially specified SOA, a photodiode, and the like, and has a complex structure, is required for the sixth or the seventh method. Industrially, it is the most preferable to extract the optical clock signal in a stable manner without depending on the plane of polarization of the input optical signal, using a simple device which may be realized by a single element. If the optical clock signal is realized by the single element, maintenance of the simple device is more easily performed, and stable operation is more reliably executed in comparison with a case in which the above-described device, which is provided with a number of components, and has a complex structure, is used.

If there is developed a single element which has a function by which an optical clock signal may be extracted from an input optical signal in a stable manner without depending on the plane of polarization of the input optical signal, the above element may be inexpensively provided, using a technology by which a high degree of integration and mass production of a semiconductor are realized.

Accordingly, an object of the present invention is to provide a passive mode-locked semiconductor laser diode and an optical clock signal extracting device including the above laser diode, wherein the passive mode-locked semiconductor laser diode is an element with a simple configuration having properties similar to those of a single element, and may extract, from an input optical signal without depending on the polarization direction of the input optical signal, an optical clock signal with a repetition frequency corresponding to the bit-rate frequency (called "clock frequency" in some times) of the input optical signal. Moreover, another object of the present invention is to provide a method by which the above passive mode-locked semiconductor laser diode and the optical clock signal extracting device are activated.

SUMMARY OF THE INVENTION

A passive mode-locked semiconductor laser diode according to a first aspect of the present invention includes a gain region in which a population inversion is formed, and a saturable absorption region with a function modulating light intensity, and is a semiconductor laser diode in which the gain region and the saturable absorption region are arranged in series. Here, the characteristic of the invention is to satisfy the following conditions.

A first condition is that, in the gain region, an optical gain for polarization (hereinafter, called "TE polarization" in some cases) with the plane of polarization in a direction in parallel with the width direction of an optical waveguide which exists in the gain region is larger than an optical gain for polarization (hereinafter, called "TM polarization" in some cases) with the plane of polarization in a direction in parallel with the thickness direction of the optical waveguide which exists in the gain region. Moreover, a second condition is that, in the saturable absorption region, the absorption saturation energy for the TM polarization is smaller than the absorption saturation energy for the TE polarization.

A passive mode-locked semiconductor laser diode according to a second aspect of the present invention includes a passive waveguide region with a variable effective-refractive-index, a gain region in which a population inversion is formed, and a saturable absorption region with a function modulating light intensity, and is a semiconductor laser diode in which the passive waveguide region, the gain region, and the saturable absorption region are arranged in series. Here, conditions which the gain region and the saturable absorption region are required to satisfy are the same as those which the gain region and the saturable absorption region in the above-described passive mode-locked semiconductor laser diode according to the first aspect of the present invention are required to satisfy.

It is preferable that, in the passive mode-locked semiconductor laser diode according to the above-described first and second aspects of the present invention (hereinafter, called "passive mode-locked semiconductor laser diode of the present invention" in some cases), an optical waveguide which exists in the gain region is formed with bulk crystal, and an optical waveguide which exists in the saturable absorption region is formed with a quantum well structure into which extension strain is introduced. Or, it is preferable that, in the above-described passive mode-locked semiconductor laser diode according to the present invention, both of optical waveguides which exist inside the gain region and the saturable absorption region are formed with a quantum well structure into which extension strain is introduced.

A first optical clock signal extracting device according to the present invention, which is configured to use the passive mode-locked semiconductor laser diode according to the present invention, is provided with: the passive mode-locked semiconductor laser diode according to the present invention;

an input portion which inputs an input optical signal; and an output portion which outputs an optical clock signal which has been extracted from the input optical signal by the passive mode-locked semiconductor laser diode.

Preferably, the input portion is provided with a first optical isolator which prevents returning light from being input to an optical transmission line transmitting the input optical signal and with a first coupling optical system by which the input optical signal is output to the passive mode-locked semiconductor laser diode.

Preferably, the output portion is provided with a second optical isolator which prevents returning light from being input to the passive mode-locked semiconductor laser diode and with a second coupling optical system by which the optical clock signal extracted by the passive mode-locked semiconductor laser diode is output to the input end of an optical transmission line. Moreover, it is preferable that the output portion is provided with the second optical isolator and the second coupling optical system, and, furthermore, with a wavelength filter which filters the optical clock signal extracted by the passive mode-locked semiconductor laser diode.

Moreover, a second optical clock signal extracting device including the passive mode-locked semiconductor laser diode according to the present invention is provided with the passive mode-locked semiconductor laser diode according to the present invention, and an input-output portion which inputs an input optical signal, and outputs an optical clock signal extracted from the input optical signal by the passive mode-locked semiconductor laser diode.

Preferably, the input-output portion is provided with an optical circulator which has a first port for input of the optical signal, a second port for output of the input optical signal and input of the optical clock signal extracted by the passive mode-locked semiconductor laser diode, and a third port outputting the optical clock signal, and a coupling optical system which outputs the input optical signal output from the second port to the passive mode-locked semiconductor laser diode, and the optical clock signal extracted by the passive mode-locked semiconductor laser diode to the second port.

Preferably, the input-output portion is provided with the above-described optical circulator, and the above-described coupling optical system, and, furthermore, with a wavelength filter which filters the optical clock signal extracted by the passive mode-locked semiconductor laser diode.

In a similar manner to that of the above-described first optical clock signal extracting device, the third optical clock signal extracting device according to the present invention, which uses the passive mode-locked semiconductor laser diode according to the present invention, is provided with the passive mode-locked semiconductor laser diode according to the present invention, the input portion which inputs the input optical signal, and the output portion which outputs the optical clock signal extracted from the input optical signal by the passive mode-locked semiconductor laser diode. However, the configuration of the input portion is different from that the above-described first optical clock signal extracting device.

The input portion of the third optical clock signal extracting device is provided with a first polarization separating and coupling device, an optical attenuator, or an optical amplifier, a second polarization separating and coupling device, and a first coupling optical system The first polarization separating and coupling device separates an input optical signal into a first input optical signal and a second input optical signal. The optical attenuator adjusts the strength of the first input optical signal for output as a first adjusted input optical signal. The second polarization separating and coupling device couples the first adjusted input optical signal and the second input optical signal for output as an adjusted input optical signal. The first coupling optical system outputs the adjusted input optical signal output from the second polarization separating and coupling device to the passive mode-locked semiconductor laser diode.

Or, the optical amplifier amplifies the strength of the second input optical signal for output as the second adjusted input optical signal, and the second polarization separating and coupling device couples the first adjusted input optical signal output from the optical amplifier and the first input optical signal for output as an adjusted input optical signal. The first coupling optical system outputs the adjusted input optical signal output from the second polarization separating and coupling device to the passive mode-locked semiconductor laser diode.

Preferably, the input portion of the third optical clock signal extracting device is provided with the above-described first polarization separating and coupling device, the optical attenuator or the optical amplifier, the second polarization separating and coupling device, and the first coupling optical system, and, furthermore, a first optical isolator which prevents returning light from being input to an optical transmission line transmitting the input optical signal.

A method for extracting an optical clock signal according to the present invention is a method by which an optical clock signal is extracted from an input optical signal in the above-described first through third optical clock signal extracting devices by driving the passive mode-locked semiconductor laser diode in a state in which any of longitudinal-mode oscillation wavelengths of the extracted optical clock signal are not in accordance with a peak wavelength in the frequency spectrum of the input optical signal.

When the input optical signal is input to the semiconductor laser in which the gain region and the saturable absorption region are arranged in series, the orbiting frequency of optical pulses in the semiconductor laser diode and the bit-rate frequency of the input optical signal are in synchronization with each other, and the optical clock signal is extracted because the obtained mode-locking pulse may be treated as an optical clock extracted from the input optical signal. The passive mode-locked semiconductor laser diode according to the first invention has a configuration in which an optical gain for the TE polarization is larger than that for the TM polarization in the gain region. Thereby, the polarization of the oscillation light of the passive mode-locked semiconductor laser diode is limited to the TE one.

Absorption saturation is generated by the input optical signal in the saturable absorption region to modulate the optical absorption coefficient. Then, the optical clock signal is generated and is output by the above modulation, because the oscillation state of the passive mode-locked semiconductor laser diode according to the first invention is in synchronization with the bit-rate frequency, that is, the repetition frequency of the train of optical pulses of the input optical signal which has been input. Accordingly if the modulation of the optical absorption coefficient caused in the saturable absorption region does not depend on the polarization direction of the input optical signal, there is realized the passive mode-locked semiconductor laser diode in which the optical clock signal may be extracted from the input optical signal without depending on the polarization direction of the input optical signal.

Though the details will be described later, the change in the carrier density of the saturable absorption region is required to be the same for both of the TE polarization and the TM one of the input optical signal in order to realize a state in which the modulation of the optical absorption coefficient caused in the saturable absorption region does not depend on the polarization direction of the input optical signal. The inventors of the present invention have theoretically confirmed that equal change in the carrier density without depending on the polarization direction of the input optical signal may be realized by a configuration in which the absorption saturation energy for the TM polarization is smaller than the absorption saturation energy for the TE polarization in the saturable absorption region of the passive mode-locked semiconductor laser diode according to the first invention.

Moreover, the method for extracting the optical clock signal according to the present invention is a method in which the passive mode-locked semiconductor laser diode is driven in a state in which any of longitudinal-mode oscillation wavelengths of the optical clock signal extracted in the passive mode-locked semiconductor laser diode according to the first or second invention are not in accordance with a peak wavelength in the frequency spectrum of the input optical signal. Though the details will be described later, the optical clock signal with small time jitters may be equally extracted according to the above-described driving even when the polarization state of the input optical signal is either the TE polarization or the TM one. That is, in the method for extracting the optical clock signal according to the present invention, the optical clock signal may be extracted without depending on the polarization direction of the input optical signal by the first or the second optical clock signal extracting device.

The passive mode-locked semiconductor laser diode according to the second invention is a semiconductor laser diode which includes the passive waveguide region with a variable effective refractive index, and in which the gain region and the saturable absorption region are arranged in series. By injecting a current into the passive waveguide region, there may be adjusted the effective refractive index of the optical waveguide in which the region exists. The state in which any of longitudinal-mode oscillation wavelengths of the above-described extracted optical clock signal may be easily realized by adjusting the above effective refractive index.

The above-described first and second conditions may be easily satisfied in the above-described passive mode-locked semiconductor laser diode according to the present invention by a configuration in which the optical waveguide which exists in the gain region is formed with bulk crystal, and the optical waveguide which exists in the saturable absorption region is formed with the quantum well structure into which extension strain is introduced, though the details will be described later. Or, the first and second conditions may be further easily satisfied by a configuration in which both of the optical waveguides which exist inside the gain region and the saturable absorption region are formed with the quantum well structure into which extension strain is introduced.

The first optical clock signal extracting device may be formed by providing the input portion which inputs the input optical signal for extracting the optical clock signal, and the output portion which outputs the optical clock signal in the passive mode-locked semiconductor laser diode according to the present invention. As this first optical clock signal extracting device uses the passive mode-locked semiconductor laser diode according to the present invention as a component with a function for output of the optical clock signal, the optical clock signal may be extracted without depending on the polarization direction of the input optical signal as described above.

A light element (hereinafter, called "returning light" in some cases) which is reflected by the incidence end surface of the passive mode-locked semiconductor laser diode according to the present invention and returns to the optical transmission line again may be interrupted by providing the optical isolator which prevents returning light from inputting to the optical transmission line transmitting the input optical signal to the input portion. When the returning light is input to the optical transmission line, there are caused malfunctions and the like in a device and the like, which form the optical communication system, other than the optical clock signal extracting device. Accordingly, a configuration in which the returning light is prevented from being input to the optical transmission line again is an important one among the requirements for forming the optical clock signal extracting device.

Moreover, the returning light element which is reflected by the incidence end surface of the optical transmission line and the like to which the optical clock signal is input, and returns to the passive mode-locked semiconductor laser diode according to the present invention again may be interrupted by providing the optical isolator in the output portion too (hereinafter, the returning element which is reflected by the incidence end surface of the optical transmission line and the like, and returns to the passive mode-locked semiconductor laser diode again is also called "returning light" in some cases). When the returning light is input to the passive mode-locked semiconductor laser diode, there are caused troubles in the mode-locked operation. Accordingly, a configuration in which the returning light element is prevented from being input to the optical transmission line again is an important one among the requirements for forming the optical clock signal extracting device.

Moreover, only wavelength elements of the optical clock signal may be taken out from the output light output from the passive mode-locked semiconductor laser diode by further providing the wavelength filter which filters the optical clock signal extracted from the passive mode-locked semiconductor laser diode, in addition to the optical isolator and the second coupling optical system. A noise element, other than the optical clock signal, may be interrupted by the above-described configuration wherein the noise element is slightly generated from the passive mode-locked semiconductor laser diode and the like.

The second optical clock signal extracting device may be formed by providing the input-output portion which inputs the input optical signal to the passive mode-locked semiconductor laser diode according to the present invention, and outputs the optical clock signal extracted from the input optical signal by the passive mode-locked semiconductor laser diode. As this second clock signal extracting device also uses the passive mode-locked semiconductor laser diode as a component with a function which outputs the optical clock signal, the optical clock signal may be extracted without depending on the polarization direction of the input optical signal as described above.

When the input-output portion is provided with the optical circulator which has the first port for input of the optical signal, the second port for output of the input optical signal and input of the optical clock signal extracted by the passive mode-locked semiconductor laser diode, and the third port outputting the optical clock signal, and the coupling optical system which outputs the input optical signal output from the second port to the passive mode-locked semiconductor laser diode and the optical clock signal extracted by the passive mode-locked semiconductor laser diode to the second port, one end surface of the passive mode-locked semiconductor laser diode may be used as input and output end surfaces.

That is, the input end for the input optical signal and the output end for the optical clock signal may be located at a common position in the optical clock signal extracting device. When the optical clock signal extracting device is used in the optical communication system, the optical clock signal extracting device may be made smaller by locating the input end of the input optical signal and the output end of the optical clock signal at a common position for convenience of the device configuration.

Only wavelength elements of the optical clock signal may be taken out from the output light output from the passive mode-locked semiconductor laser diode even in the input-output portion by further providing the wavelength filter which filters the optical clock signal extracted from the passive mode-locked semiconductor laser diode, in addition to the above-described optical circulator. The above-described noise element, other than the optical clock signal, may be interrupted by the above configuration.

The third optical clock signal extracting device may be formed by a configuration in which the passive mode-locked semiconductor laser diode is provided with the input portion having the first polarization separating and coupling device, the optical attenuator or the optical amplifier, the second polarization separating and coupling device, and the first coupling optical system. The input optical signal is separated into the first input optical signal and the second input optical signal by the first polarization separating and coupling device, and the optical attenuator adjusts and attenuates the strength of the first input optical signal as the first adjusted input optical signal. Or, the optical amplifier adjusts and amplifies the strength of the second input optical signal as the second adjusted input optical signal.

The second polarization separating and coupling device couples the first adjusted input optical signal and the second input optical signal, or the second adjusted input optical signal and the first input optical signal for output as the adjusted input optical signal. That is, the strengths of the first and the second input optical signals are adjusted by the optical attenuator or the optical amplifier. Though the object of the third optical clock signal extracting device is generally accomplished when one of the optical attenuator or the optical amplifier is used, the strengths of the first and the second input optical signals may be adjusted by using both of the optical attenuator and the optical amplifier.

That is, even when there is polarization dependence unique to the passive mode-locked semiconductor laser diode according to the present invention, wherein the diode is used in the third optical clock signal extracting device, the optical clock signal may be extracted without depending on the polarization by adjusting the strengths/strength of the first and/or the second input optical signal though the details will be described later.

The effect that the returning element which is reflected by the incidence end surface of the passive mode-locked semiconductor laser diode according to the present invention and returns to the optical transmission line again is interrupted may be obtained by providing the optical isolator even in the input portion of the third optical clock signal extracting device.

BRIEF DESCRIPTION OF THE DRAWINGS

Other objects and advantages of the present invention will be described with reference to the following attached drawings, in which.

DESCRIPTION OF THE PREFERRED EMBODIMENTS

Hereinafter, embodiments according to the present invention will be explained, referring to drawings. Here, each of the drawings illustrates a configuration example according to the present invention, and is only a schematic view showing the arrangement of members and the like for easy understanding of the present invention, and the present invention is not limited to the illustrated examples. Moreover, though specific materials and conditions, and the like will be used in the following explanations in some cases, the above materials and conditions are only preferable examples, and, accordingly, the present invention will not be limited to the materials and conditions. Moreover, duplicated explanations of similar members throughout the drawings will be eliminated in some cases. Moreover, an optical path will be shown by a thick line, and a transmission line for an electric signal will be shown by a thin line.

<Passive Mode-Locked Semiconductor Laser Diode According to a First Invention>

Figure 1A:
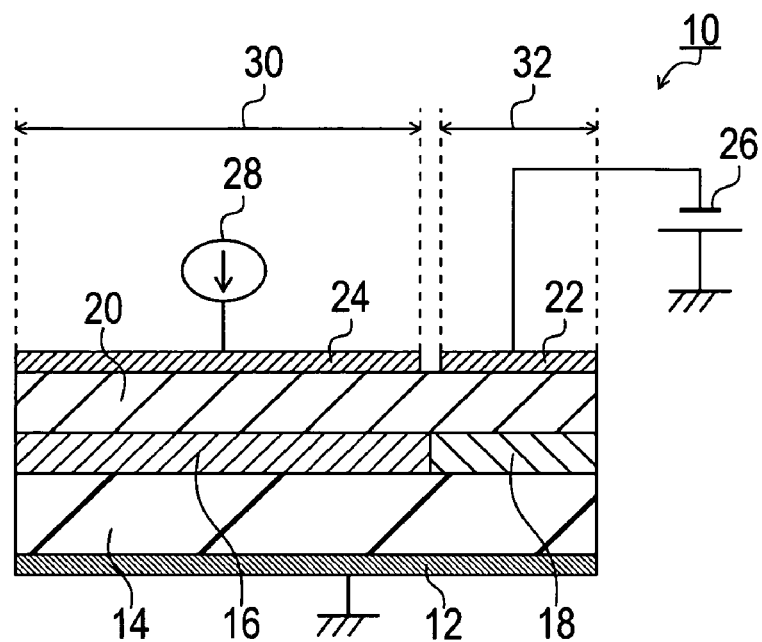
FIG. 1A is a schematic and structural view of an MLLD according to a first aspect of the present invention.

The structure of the passive mode-locked semiconductor laser diode according to the first invention will be explained, referring to FIGS. 1A and 1B. Hereinafter, the passive mode-locked semiconductor laser diode will be abbreviated MLLD. FIG. 1A is a schematic and structural side view of the passive mode-locked semiconductor laser diode according to the first invention (hereinafter, called "MLLD 10") seen from a direction perpendicular to the direction of an optical waveguide, and FIG. 1B is a schematic and structural view of the passive mode-locked semiconductor laser diode seen from the side of the optical waveguide 18 in a direction opposing to the direction of the optical waveguide.

The MLLD 10 includes, a gain region 30 in which population inversion is formed, and a saturable absorption region 32 with a function by which optical intensity is modulated, and is a semiconductor laser diode in which the gain region 30 and the saturable absorption region 32 are arranged in series. The gain region 30 and the saturable absorption region 32 are formed monolithic as shown in FIG. 1A. A current is applied to the gain region 30 from a constant current source 28 through an n-type common electrode 12 and a p-type electrode 24 of the gain region 30. A reverse biased voltage is applied to the saturable absorption region 32 from a constant voltage source 26 through the n-type common electrode 12 and the p-type electrode 22 of the saturable absorption region 32.

Both an optical waveguide 16 (hereinafter, also called "optical waveguide 16 of the gain region 30") which exists in the gain region 30, and the optical waveguide 18 (hereinafter, also called "optical waveguide 18 of the saturation absorption area 32") which exists in the saturable absorption region 32 are configured to be located between a first clad layer 14 and a second clad layer 20, which are common to the waveguides 16 and 18. Here, it is assumed that the first clad layer 14 is an n-type clad layer, and the second clad layer 20 is a p-type clad layer. A crystalline material forming the optical waveguides 16 and 18 is decided by the wavelength of an input optical signal input to the MLLD 10. When the wavelength of the above input optical signal is in, for example, a 1.5 μm band, a quantum well structure using a bulk crystalline material of indium phosphide (InP) system semiconductor, or a crystalline material of InP system semiconductor is applied.

Figure 1B:
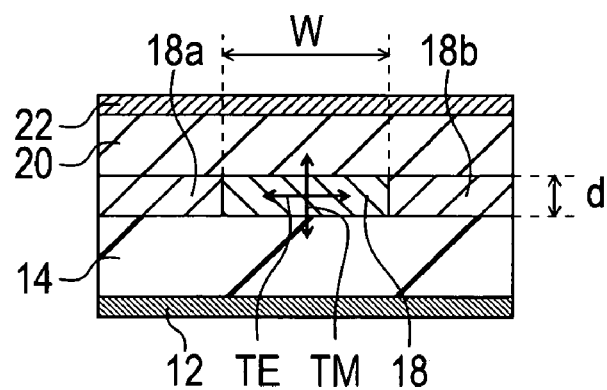
FIG. 1B is a schematic and structural view of the MLLD according to the first aspect of the present invention.

A cross section in a direction perpendicular to the waveguide direction of the optical waveguides 16 and 18 is a rectangular optical waveguide with a width of w and a thickness of d as shown in FIG. 1B. The state of the polarization of the input optical signal will be defined as follows. That is, when the direction of the plane of polarization (oscillating surface of a vector in the optical electric field) of light propagating in the optical waveguides 16 and 18 is parallel with the width direction of these optical waveguides (the horizontal direction in FIG. 1B), the polarization is assumed to be TE polarization, and, when the direction of the plane of polarization of light propagating in the optical waveguides is parallel with the thickness direction (the vertical direction in FIG. 1B), the poralization is assumed to be TM polarization.

Here, the optical waveguide 16 in the gain region 30 is assumed to be formed with a quantum well structure in which bulk crystal or extension strain is introduced. Hereinafter, explanation will be made, assuming that the polarization state of oscillation light in the MLLD 10 is TE polarization. Hereinafter, operation of laser oscillation in which oscillation light is of TE polarization is called TE-mode operation, and the waveguide modes of oscillation light in the optical waveguides 16 and 18 are also called TE mode. Similarly, operation of laser oscillation in which oscillation light is of TM polarization is called TM-mode operation, and the waveguide modes of oscillation light in the optical waveguides 16 and 18 are also called TM mode.

Now, a condition (the above-describe first condition) that an optical gain for the TE polarization is higher than that for the TM polarization in the gain region will be explained.

In the optical waveguide 16 in the gain region 30, the optical gain per unit length in the optical waveguide 16 for the TE mode is given by $\tau_{TE} \cdot g_{TE}$, and that for the TM mode is given by $\tau_{TM} \cdot g_{TM}$. Here, $\tau_{TE}$ is an optical confinement coefficient for the TE mode, $\tau_{TM}$ is an optical confinement coefficient for the TM mode, $g_{TE}$ is a material gain for the TE mode, and $g_{TM}$ is a material gain for the TM mode. $g_{TE}$ and $g_{TM}$ are a peculiar values to the material which composes optical waveguide 16. Moreover, $\tau_{TE}$ and $\tau_{TM}$ are decided by the refractive index of a material forming the optical waveguide 16, and the dimensions, that is, the width w and the thickness d of the optical waveguide 16.

The condition that an optical gain for the TE mode is higher than that for the TM mode in the gain region is expressed in the following formula (1), using the above-described optical confinement coefficients τ, and the material gains g.

$$\tau_{TE} \cdot g_{TE} > \tau_{TM} \cdot g_{TM} \tag{1}$$

Moreover, the optical gain $\tau_{TM} \cdot g_{TM}$ for the TM mode is set in such a way that the above value becomes a value sufficiently larger than zero. That is, the optical gain $\tau_{TM} \cdot g_{TM}$ for the TM mode is set in such a way that the following formula (2) is satisfied:

$$\tau_{TM} \cdot g_{TM} > 0 \tag{2}$$

On the other hand, a condition (the above-described second condition) that the absorption saturation energy for the TM mode is smaller than the absorption saturation energy for the TE mode in the saturable absorption region will be explained.

An optical absorption coefficient α of the saturable absorption region 32 is in proportion to the carrier density N, and is given by the following formula (3):

$$\alpha = \tau A(N - N_0) \tag{3}$$

Where, A is a differential gain, and $N_0$ is a carrier density in a transparent state.

Moreover, the absorption saturation energy $E_{sat}$ is given by the following formula (4):

$$E_{sat} = ((h/2\pi) \omega_0 \cdot w \cdot d)/(\tau A) \tag{4}$$

Where h is the Planck's constant, and $\omega_0$ is an optical angular frequency of the input optical signal.

Assuming that the differential gain for the TE mode in the optical waveguide 18 is assumed to be $A_{TE}$ and that for the TM mode in the optical waveguide 18 is assumed to be $A_{TM}$, both the differential gains are set in such a way that the following formula (5) is satisfied:

$$\tau_{TM} \cdot A_{TM} > \tau_{TE} \cdot A_{TE} \tag{5}$$

According to the above setting, there is satisfied the condition that the absorption saturation energy $E_{sat, TE}$ for the TE mode is smaller than the absorption saturation energy $E_{sat, TM}$ for the TM mode, that is, $E_{sat, TE} > E_{sat, TM}$ is satisfied.

<First Optical Clock Signal Extracting Device>

Figure 2:
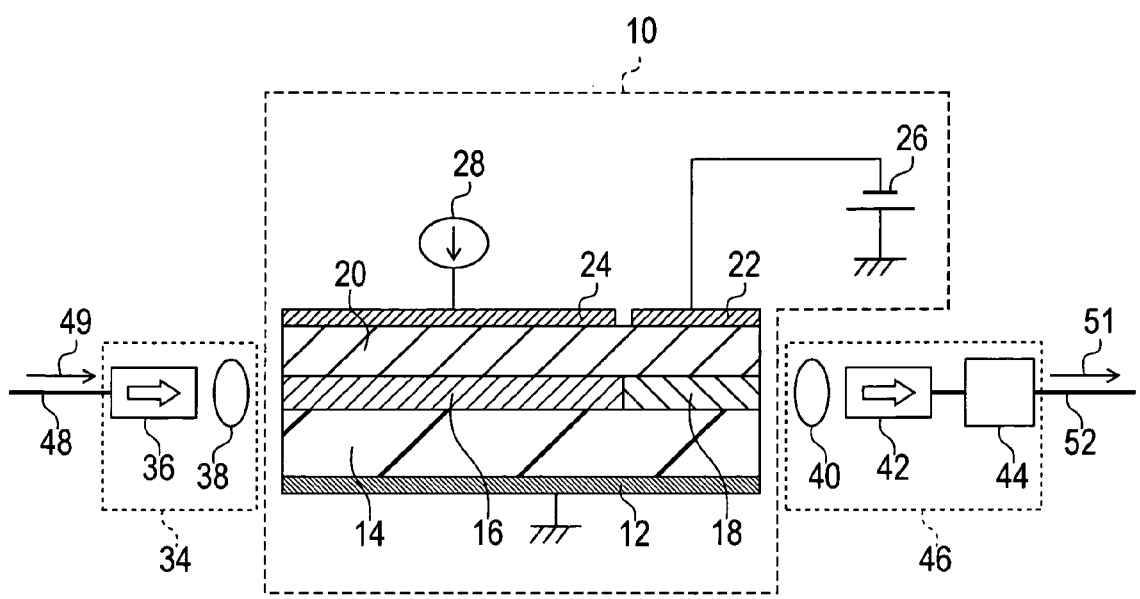
FIG. 2 is a schematic and structural view of a first optical clock signal extracting device using the MLLD according to the first aspect of the invention.

The configuration of a first optical clock signal extracting device will be explained, referring to FIG. 2. FIG. 2 is a schematic and structural side view of the first optical clock signal extracting device using the MLLD 10 according to the first invention, seen from a direction perpendicular to the optical waveguide direction of the first optical clock signal extracting device.

The first optical clock signal extracting device according to the present invention, which is configured to use the MLLD 10 of the first invention, is provided with the MLLD 10, an input portion 34 for input of an input optical signal 49, and an output potion 46 which outputs an optical clock signal 51 extracted from the input optical signal by the MLLD 10.

The input portion 34 is provided with a first optical isolator 36 which prevents returning light from being input to an optical transmission line 48, through which the input optical signal 49 passes and a first coupling optical system 38 which outputs the input optical signal to the MLLD 10 according to the present invention.

The output potion 46 is provided with a second optical isolator 42 which prevents returning light from being input to the MLLD 10, and a second coupling optical system 40 which outputs the input optical signal extracted by the MLLD 10 to the input end of an optical transmission line 52.

Moreover, the portion 46 is further provided with a wavelength filter 44 which filters the optical clock signal extracted from the MLLD 10 in addition to the second optical isolator 42 and the second coupling optical system 40.

Though the first coupling optical system 38 and the second coupling optical system 40 are configured to use a convex lens in the present embodiment, not only the convex lens, but also a graded refractive index optical-waveguide, a holographic optical element, and the like may be used, wherein the optical-waveguide and the optical element have a light gathering function.

The first optical isolator 36 may use a polarization independent type optical isolator, and the second optical isolator 42 may use a polarization independent type optical isolator or a polarization dependence type optical isolator using a magnetic garnet crystal, and the like after adequate selection. Moreover, the wavelength filter 44 may use any one of wavelength filters using dielectric multilayered layers after adequate selection.

The above-described configuration is only one configuration example of the output potion 46, though FIG. 2 has a configuration in which the output light from the MLLD 10 is input to the second optical isolator 42 through the second coupling optical system 40, and the output light from the second optical isolator 42 is input to the wavelength filter 44, and the output light from the wavelength filter 44 is input to the input end of the optical transmission line 52. It should be understood that the coupling optical system 40 is a general term for a coupling optical system such as a convex lens through which the output light from the MLLD 10 is input to the second optical isolator 42, a convex lens which the output light from the second optical isolator 42 is input to the wavelength filter 44, and a convex lens through which the output light from the wavelength filter 44 is input to the input end of the optical transmission line 52.

<Second Optical Clock Signal Extracting Device>

Figure 3:
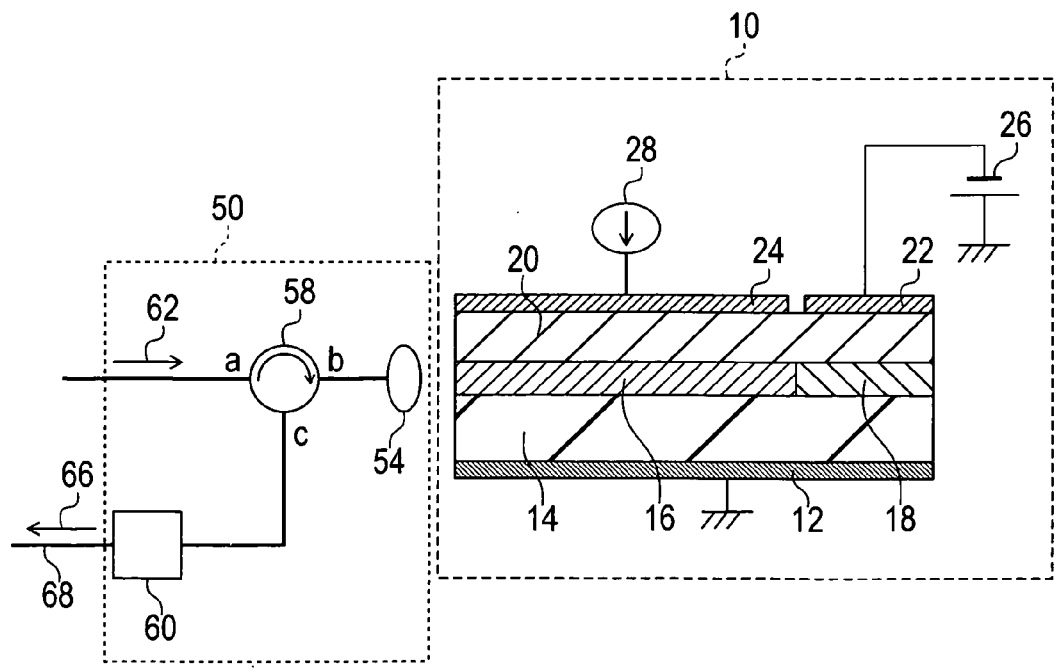
FIG. 3 is a schematic and structural view of a second optical clock signal extracting device using the MLLD according to the first aspect of the invention.

The configuration of a second optical clock signal extracting device will be explained, referring to FIG. 3. FIG. 3 is a schematic and structural side view of the second optical clock signal extracting device using the MLLD 10 according to the first invention, seen from a direction perpendicular to the optical waveguide direction of the second optical clock signal extracting device.

The second optical clock signal extracting device according to the present invention, which is configured to use the MLLD 10 of the first invention, is provided with the MLLD 10, and an input-output portion 50 to which an input optical signal 62 is input, and outputs an optical clock signal 66 extracted by the MLLD 10 to the input end of the optical transmission line 68.

This input-output portion 50 is provided with an optical circulator 58 which has a first port for input of the optical signal 62, a second port b for output of the input optical signal and input of the optical clock signal extracted by the MLLD 10, and a third port c outputting the optical clock signal, and a coupling optical system 54 which outputs the output light from the second port b to MLLD 10 and the optical clock signal extracted by the MLLD 10 to the second port b.

Moreover, this input-output portion 50 is further provided with a wavelength filter 60, which filters the optical clock signal extracted from the MLLD 10, in addition to the above-described optical circulator 58 and the coupling optical system 54.

Though the coupling optical system 54 is configured to use a convex lens in the present embodiment in a similar manner to that of the above-described first optical clock signal extracting device, not only the convex lens, but also a graded refractive index optical-waveguide, a holographic optical element, and the like may be used, wherein the optical-waveguide and the optical element has a light gathering function. Moreover, the wavelength filter 60 may use any one of wavelength filters using dielectric multilayered layers after adequate selection in a similar manner to that of the above-described first optical clock signal extracting device.

<Extraction of Optical Clock Signal>

Operation of extraction for a clock signal is performed under the following condition: That is, the MLLD is driven under a state in which any of longitudinal-mode oscillation wavelengths of the extracted optical clock signal are not in accordance with a peak wavelength in the frequency spectrum of the input optical signal. There will be explained in detail as follows a configuration in which, according to the above-described driving, an optical clock signal with low time jitters may be equally extracted when the polarization state of the input optical signal is either of the TE polarization, or the TM polarization.

Figure 4A:
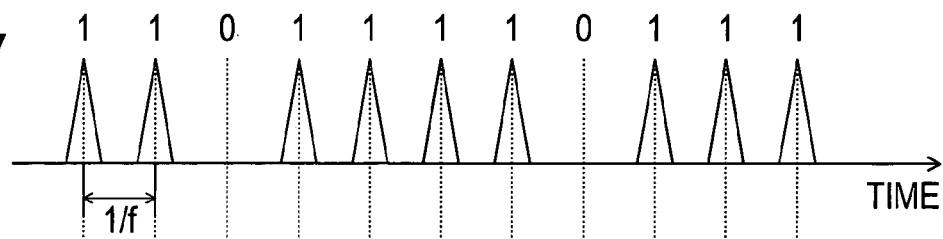
FIG. 4A is a view showing time waveforms of an input optical signal.
Figure 4B:
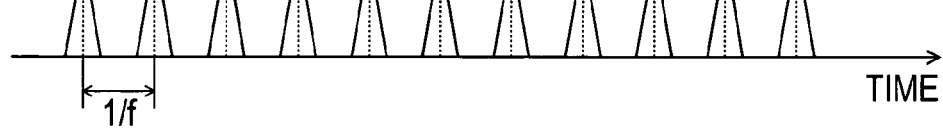
FIG. 4B is a view illustrating waveforms of the optical clock signal.
Figure 5A:
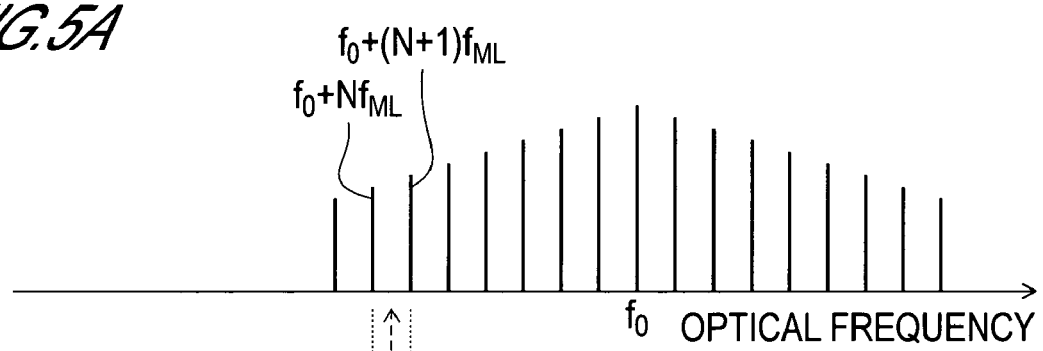
FIG. 5A is a view explaining the operation principle for extracting an optical clock signal by the MLLD according to the first aspect of the invention.
Figure 5B:
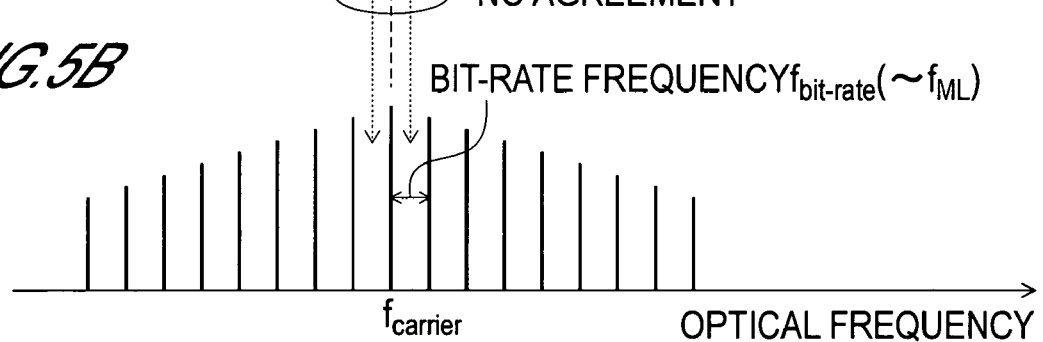
FIG. 5B is a view explaining the operation principle for extracting the optical clock signal by the MLLD according to the first aspect of the invention.

Conditions for extracting operation of the optical clock signal will be explained in the first place, referring to FIGS. 4A and 4B, and FIGS. 5A and 5B. Time is expressed on the horizontal axis in an arbitrary scale in FIGS. 4A and 4B. Moreover, optical frequencies are expressed on the horizontal axis in an arbitrary scale in FIGS. 5A and 5B. Though the vertical axis is eliminated in each of FIGS. 4A and 4B, and FIGS. 5A and 5B, optical intensities are expressed on the vertical axis in an arbitrary scale. FIG. 4A shows time waveforms of the input optical signal, and FIG. 4B illustrates waveforms of the optical clock signal. Moreover, FIGS. 5A and 5B are provide for explaining a principle by which an optical clock signal is extracted by the MLLD according to the first invention: FIG. 5A shows the longitudinal-mode oscillation of the extracted optical clock signal, and FIG. 5B illustrates the frequency spectrum of the input optical signal.

As the input optical signal from which an optical clock signal is extracted is an RZ signal which is a binary digital signal, which is a send signal, obtained by optical modulation of a train of optical pulses which are regularly arranged on a time axis at constant periodic intervals, there is a time zone (also called a time slot) in which there are no optical pulses. An interval between adjacent optical pulses, that is, a time slot width is the reciprocal 1/f of a bit-rate frequency f.

There is no optical pulse in two time slots in the case of the input optical signal shown in FIG. 4A as one example. Assuming that a state that an optical pulse exists is denoted by "1", and a state that the pulse does not exist is represented by "0", the above RZ signal means [1, 1, 0, 1, 1, 1, 1, 0, 1, 1, and 1].

On the other hand, the optical clock signal shown in FIG. 4B is a train of optical pulses which are regularly arranged on a time axis at constant periodic intervals, and an interval between adjacent optical pulses, that is, a times lot width is the reciprocal 1/f of a bit-rate frequency f even in this case. This configuration uses the following phenomena.

That is, in the frequency response characteristic of the MLLD, there are caused sharp responses by resonance at a resonator orbiting frequency (frequency approximating fML), and at frequencies natural number times as large as the orbiting frequency. The frequency spectrum distribution of the input optical signal shows a frequency spectrum in which there is a large element at the bit-rate frequency, and the distribution widely extended around the bit-rate frequency. When an optical signal is input to the MLLD, and the bit-rate frequency of the input optical signal approximates fML, the bit-rate frequency element of the input optical signal is amplified, and other elements are attenuated, based on the property of the frequency response characteristics of the MLLD. According to the method for extracting the optical clock signal of the present invention, an optical clock signal is extracted from an input optical signal, using the above-described phenomenon.

It is more quantitatively shown, referring to FIGS. 5A and 5B, that any of wavelengths in the longitudinal-mode spectrums of the extracted optical clock signal are not in accordance with a peak wavelength in the frequency spectrum of the input optical signal. Assuming that one of the frequencies forming the longitudinal-mode wavelengths is f0, the optical frequencies $f_{CLK}$ of the longitudinal-mode wavelengths of the optical clock signal are given by the following formula:

$$f_{CLK} = f_0 + (Nf_{ML})$$

Where, N is an integer, and $F_{ML}$ is an oscillation longitudinal-mode interval of the optical clock signal.

At this time, there is caused a state in which any of longitudinal-mode oscillation wavelengths of the extracted optical clock signal are not in accordance with a peak wavelength in the frequency spectrum of the input optical signal when one of a plurality of frequency spectrum elements $f_{carrier}$ in the input optical signal satisfies the following formula (6):

$$f_{carrier} = f_0 + (N+d)f_{ML} \quad (6)$$

Where the most preferable state is a state in which the value of d is equal to 0.5. That is, the peak wavelength of a plurality of frequency spectrum elements in the input optical signal is located at an intermediate position between wavelengths of the train of longitudinal-mode ones in the optical clock signal.

Hereinafter, a principle for extracting an optical clock signal according to the present invention will be explained in detail in an orderly manner: that is, firstly, (A) plane-of-polarization-independent intensity of absorption modulation caused in a saturable absorption region, and, secondly, (B) Control of the Resonance Effect.

(A) Plane-of-Polarization-Independent Intensity of Absorption Modulation caused in a Saturable Absorption Region When a polarization state of the oscillation light of the MLLD depends on that of an input optical signal, there is caused the following problem. When an optical signal is reproduced by an optical repeater and the like, an optical clock signal is extracted from the input optical signal in the first place. Then, the optical signal is reproduced from the optical clock signal. A first problem is that an optical modulator used when an optical signal is reproduced from the optical clock signal is limited to a modulator which operates in a polarization-independent state. Moreover, a second problem is that transitional unstability is caused in the polarization state of the oscillation light of the MLLD at a transition step at which the polarization state of an input optical signal is changed from the TE polarization to the TM polarization, or from the TM polarization to the TE polarization. Especially, the second problem should be absolutely avoided in order to secure the stability in extraction of an optical clock signal.

According to the above-described the formula (1), it is found that it is required to set an optical gain for the TE mode at a value larger than that for the TM mode in order to limit the polarization state of the oscillation light in the MLLD to the TE polarization. Moreover, even when the polarization of the input optical signal is TM polarization, a condition for obtaining a significant optical gain in a gain region is given by the above-described formula (2).

In a III-V compound semiconductor bulk crystal, such as InP, and gallium arsenide (GaAs), which is a mixed crystal thereof, the material gain is the same value for either the TE mode or the TM mode. That is, $g_{TE} = g_{TM}$. Moreover, in an optical waveguide with a width (w) which is sufficiently larger than the thickness (d), the optical confinement coefficient ($\tau_{TE}$) for the TE mode is larger than the optical confinement coefficient ($\tau_{TM}$) for the TM mode. That is, $\tau_{TE} > \tau_{TM}$. Accordingly, if the gain region is provided with an optical waveguide including bulk crystal, the above-described formula (1) shown as follows is satisfied in the gain region: $\tau_{TE} \cdot g_{TE} > \tau_{TM} \cdot g_{TM}$.

Moreover, the optical confinement coefficient ($\tau_{TM}$) for the TM mode is smaller than the optical confinement coefficient ($\tau_{TE}$) for the TE mode, and is a finite value. The material gain $g_{TM}$ also is a finite value. Accordingly, the product of the both, that is, $\tau_{TM} \cdot g_{TM}$, also is a value larger than 0. Therefore, the condition given by the above-described formula (2) is satisfied in the optical waveguide including the III-V compound semiconductor bulk crystal.

On the other hand, a case in which an optical waveguide in a gain region is formed with a quantum well structure will be examined. The bulk crystal and the quantum well structure are different from each other in the energy level structure. That is, a configuration using the quantum well structure causes a quantum size effect to form an energy level different from that of the bulk crystal. Concretely, the degeneracy between a light hole (LH) and a heavy hole (HH) is eliminated in a banded structure of a valence band in bulk crystal. An energy shift caused in a LH with a small effective mass is larger than that of an HH with a large effective mass in the energy level of the quantum well structure. As a result, energy (hereinafter, also called "e-LH band gap") for transition of an electron to a conduction band after an LH is formed in a valence band is larger than energy (hereinafter, also called "e-HH band gap") for transition of an electron to a conduction band after an HH is formed in a valence band.

When a carrier is injected into the gain region, it becomes easier for a population inversion to be formed, wherein the population inversion is caused after an HH is formed in a valence band, and transition (hereinafter, also called "e-HH transition") of an electron to the conduction band with a small band gap is made. That is, an optical gain by e-HH transition is obtained. Based on a selected type of transition, the e-HH transition chiefly contributes to the TE mode, and transition (hereinafter, also called "e-LH transition") of an electron to the conduction band after a LH is formed in a valence band contributes to the TM mode. Thereby, there is generally generated a large optical gain for the TE mode, and little optical gain for the TM mode in the quantum well structure. That is, $g_{TE}$ takes a large value, but $g_{TM}$ is approximately zero, or negative. Accordingly, the condition given by the above-described formula (1) is satisfied, but the condition given by the formula (2) is not satisfied in the gain region having an optical waveguide with the quantum well structure.

On the other hand, it has been known that, when extension strain is introduced into the quantum well layer, the size of the e-LH band gap becomes small. Accordingly, the size of the e-LH band gap may be brought close to that of the e-HH band gap by introducing the extension strain into the quantum well layer. As described above, the optical gain for the TM mode may have the same degree of the size as that of the optical gain for the TE mode by adopting the optical waveguide formed with the quantum well structure, into which the extension strain is introduced, in the gain region.

As the optical gain for the TM mode may be controlled as described above, the quantum well structure into which the extension strain is introduced into, for example, a semiconductor optical amplifier, a semiconductor electroabsorption modulator, and the like in order to realize the polarization independent operation. (Refer to, for example, F. Devaux, S. Chelles, A. Ougazzaden, A. Mircea, F. Huet, and M. Carre, "10 Gbit/s operation of polarization insensitive, strained InGaAsP/InGaAsP MQW electroabsorption modulator," Electron. Lett. vol. 29, No. 13, pp. 1201-1203, (1993).)

The polarization dependence of the material gain in the gain region with the optical waveguide of the strained quantum well structure will be explained, referring to FIGS. 6A through 6D. The horizontal axis indicates wavelengths graduated in nanometers (nm), and the vertical axis represents optical gains graduated in $cm^{-1}$.

The polarization dependence of the material gain shown in the drawings has been calculated by assuming a single-quantum well structure in which a single-quantum well is located between barrier layers. The calculation has been made, assuming that the barrier layer is formed with InGaAsP into which strain with a band gap wavelength of 1.36 μm has not been introduced.

Figure 6A:
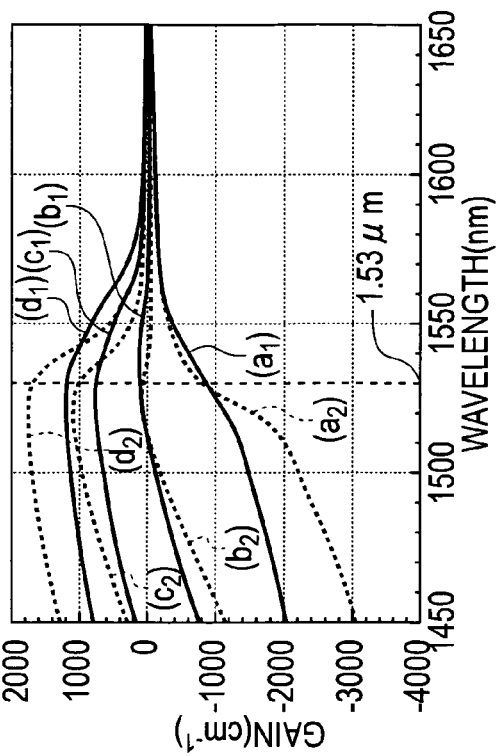
FIG. 6A is a view showing a gain spectrum of a gain region.
Figure 6B:
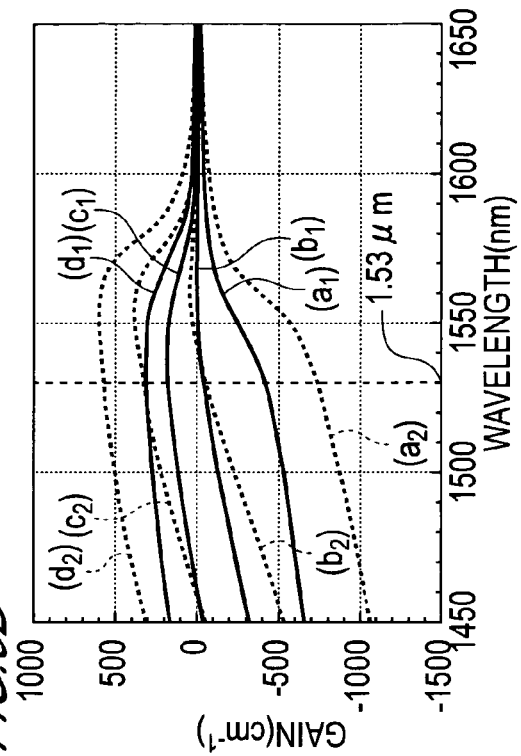
FIG. 6B is a view showing a gain spectrum of the gain region.
Figure 6C:
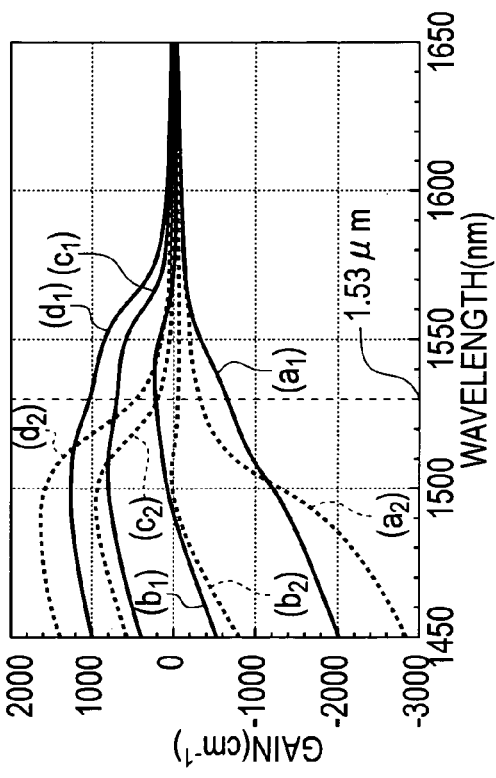
FIG. 6C is a view showing a gain spectrum of the gain region.
Figure 6D:
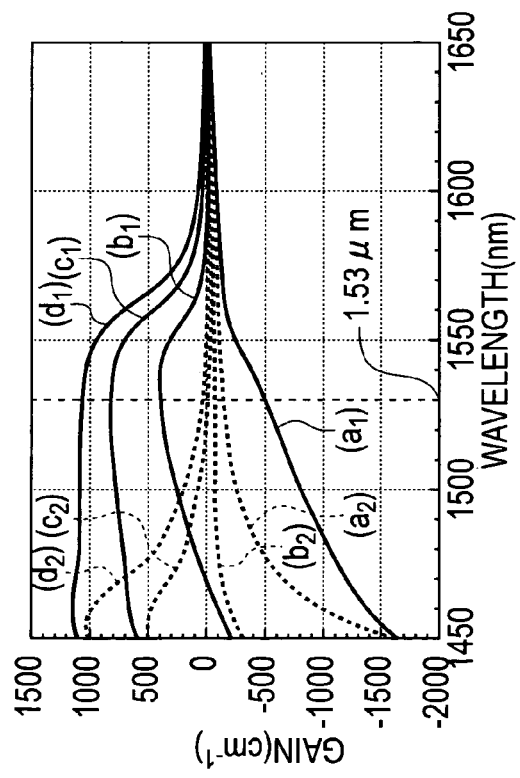
FIG. 6D is a view showing a gain spectrum of the gain region.

The material gains are calculated by changing the size of strain introduced into the quantum well layer, and the results are shown in the following drawings: FIG. 6A for a case of no introduced strain; FIG. 6B for a case in which 0.5% compression strain (in some cases, represented by −0.5% strain, expressing compression strain as strain with a minus value) is introduced; FIG. 6C for a case in which 0.25% extension strain is introduced; and FIG. 6D for a case in which 0.58% extension strain is introduced. Moreover, with regard to the band gap wavelength of the quantum well layer, the e-HH band-gap wavelength has been set at 1.53 μm when the thickness of the quantum well layer is 9 nm. Parameters and the like, which, including parameters used in calculations explained above, have been used in calculation for the material gains as shown in FIGS. 6A through 6D, are tabulated in Table 1.

TABLE 1

| Correspondence to FIGS. 6A through 6D and FIGS. 7A through 7D | Strain Amount of quantum well | Barrier Layer | Quantum well | | | | |
|---|---|---|---|---|---|---|---|
| | | | In composition | As composition | Band gap wavelength (μm) | Band gap wavelength at Width of quantum well = 9 (μm) | |
| | | | | | | e-HH | e-LH |
| (A) | 0% | No strain | 0.5982 | 0.8621 | 1.579 (for HH) | 1.53 | 1.481 |
| (B) | −0.5% (compression) | InGaAsP Band gap wavelength: 1.36 μm | 0.7248 | 0.7481 | 1.584 (for HH) | | 1.439 |
| (C) | 0.25% (extension) | | 0.5328 | 0.9234 | 1.608 (for LH) | | 1.506 |
| (D) | 0.58% (extension) | | 0.4496 | 0.9976 | 1.636 (for LH) | | 1.545 |

The solid lines show the material gains for the TE mode, and the dashed lines represent the material gains for the TM mode in FIGS. 6A through 6D. Moreover, the material gains are calculated, changing the density of the injected carriers to (a) $1 \times 10^{18}$ $cm^{-3}$, (b) $3 \times 10^{18}$ $cm^{-3}$, (c) $5 \times 10^{18}$ $cm^{-3}$, and (d) $7 \times 10^{18}$ $cm^{-3}$. The material gains corresponding to each of the changed densities of injected carriers are represented by ($a_1$), ($b_1$), ($c_1$), and ($d_1$) for the TE mode and by ($a_2$), ($b_2$), ($c_2$), and ($d_2$) for the TM mode in FIGS. 6A through 6D, respectively.

It is found that the material gains ($g_{TM}$) for the TM mode are in a region from an approximately zero value to a negative value in $cm^{-1}$ because it is shown in FIGS. 6A and 6B that the material gains in the quantum well, into which the strain has not been introduced, or the compressive strain has been introduced at a wavelength of 1.53 μm (1530 nm), are in a region from approximately zero to a negative region at a position of a wavelength of 1.53 μm (1530 nm) on the curves of ($a_2$), ($b_2$), ($c_2$), and ($d_2$) represented by the dashed lines. On the other hand, it is found from FIGS. 6C and 6D that the material gain ($g_{TM}$) for the TM mode may be obtained according to the quantum well into which the extension strain has been introduced because it is shown in the drawings that the material gain is equal to or larger than 0 at a position of 1.53 μm in wavelength on the curves of ($c_2$) and ($d_2$) represented by the dashed lines. Especially, it is found from FIG. 6D that, when the 0.58% extension strain is introduced, the material gains ($g_{TM}$) for the TM mode may be configured to be larger than those ($g_{TE}$) for the TE mode under appropriate setting of the density of the injected carrier.

It is found from the above-described calculation results that the conditions for optical gains given by the above-described formulae (1) and (2) may be satisfied by adopting the quantum well structure introducing moderate extension strain into the optical waveguide forming the gain region.

Subsequently, there will be explained the modulation of the optical absorption coefficient in the saturable absorption region.

When the input optical signal is input from the input portion 34 to the MLLD 10 according to the first invention in the first optical clock signal extracting device shown in FIG. 2, the signal is input to the saturable absorption region 32 after propagating through the gain region 30. Absorption saturation is caused in the saturable absorption region 32 by the input optical signal which has been input. The optical absorption coefficient of the optical waveguide 18 in the saturable absorption region is optically modulated by the caused absorption saturation. The orbiting frequency of light in the MLLD 10 and the bit-rate frequency of the input optical signal are synchronized by the above modulation, and the optical clock signal is generated and extracted in the MLLD 10. This optical clock signal is output from the output potion 46 as the optical clock signal 51.

When the optical waveguide 18 in the saturable absorption region 32 may be formed in such a way that the modulation factor of the optical absorption coefficient caused in the saturable absorption region 32 does not depend on the plane of polarization of the input optical signal, one of necessary conditions is satisfied in order to realize the object of the present invention, wherein the conditions are required for extraction of the optical clock signal without depending on the plane of polarization of the input optical signal.

The optical absorption coefficient in the saturable absorption region is given by the following formula (7) for the TE mode, and by the following formula (8) for the TM mode.

$$\alpha_{TE}(N') = \tau_{TE} A_{TE} (N' - N_{0,TE}) \quad (7)$$

$$\alpha_{TM}(N') = \tau_{TM} A_{TM} (N' - N_{0,TM}) \quad (8)$$

Where N' is a carrier density when the input optical signal does not exist in the optical waveguide 18 of the saturable absorption region 32. $N_{0,TE}$ is a carrier density at a transparent state for the TE mode and $N_{0,TM}$ is one for the TM mode.

Moreover, a change in the optical absorption coefficient of the saturable absorption region 32 is given by the following formula (9) for the TE mode, and by the following formula (10) for the TM mode.

$$\alpha_{TE}(P_{TE}) = \frac{\alpha_{TE}(N')}{1 + \frac{P_{TE}}{E_{sat,TE}}} \quad (9)$$

$$\alpha_{TM}(P_{TM}) = \frac{\alpha_{TM}(N')}{1 + \frac{P_{TM}}{E_{sat,TM}}} \quad (10)$$

Where $E_{sat,TE}$ is the absorption saturation energy for the TE mode and is given by the following formula (11), and $E_{sat,TM}$ is one for the TM mode and is given by the following formula (12).

$$E_{sat,TE} = ((h/2\pi)\omega_0 \cdot w \cdot d)/(\tau_{TE} A_{TE}) \quad (11)$$

$$E_{sat,TM} = ((h/2\pi)\omega_0 \cdot w \cdot d)/(\tau_{TM} A_{TM}) \quad (12)$$

Moreover, $P_{TE}$ represents the intensity for the TE mode element of the input optical signal at reaching the saturable absorption region 32 and is given by the following formula (13). Furthermore, P (TM) denotes the intensity for the TM mode element of the input optical signal at reaching the saturable absorption region 32 and is given by the following formula (14).

$$P_{TE} = P \cdot \exp(\tau_{TE} \cdot g_{TE} \cdot L_g) \quad (13)$$

$$P_{TM} = P \cdot \exp(\tau_{TM} \cdot g_{TM} \cdot L_g) \quad (14)$$

Where P represents the intensity just before the input optical signal is input from the input portion 34 to the MLLD 10, and $L_g$ indicates the length of the gain region.

From the above-described formula (7), a change in the optical absorption coefficient $\alpha_{TE}$ is proportional to the carrier density N, that is, $((N' - N_{0,TE})$, and, from the above-described formula (8), a change in the optical absorption coefficient $\alpha_{TM}$ is proportional to the carrier density N, that is, $(N' - N_{0,TM})$. Accordingly, it is found that each carrier density N is required to be changed in an equal manner in the saturable absorption region of the MLLD 10 in order to realize a state in which the modulation factor of the optical absorption coefficient does not depend on the plane of polarization of the input optical signal.

From the above-described formula (7), a change $\Delta\alpha(TE)$ in the optical absorption coefficient for the TE polarization to a change $\Delta N$ in the carrier density N is given by the following formula (15).

$$\Delta\alpha_{TE} = \alpha_{TE}(N' + \Delta N) - \alpha_{TE}(N') = \tau_{TE} A_{TE} \Delta N \quad (15)$$

On the other hand, a change $\Delta\alpha_{TE}$ in the optical absorption coefficient, based on absorption saturation generated by input of the TE polarization, is given by the following formula (16).

$$\Delta\alpha_{TE} = \alpha_{TE}(P_{TE} = 0) - \alpha_{TE}(P_{TE}) = \frac{\alpha_{TE}(N')}{1 + \frac{E_{sat,TE}}{P_{TE}}} \quad (16)$$

A change $\Delta N$ in the carrier density is given by the following formula (17) from the formulae (15) and (16) when the input optical signal is TE polarization. Similarly, a change $\Delta N$ in the carrier density is given by the following formula (18) when the input optical signal is TM polarization.

$$\Delta N = \frac{N' - N_{0,TE}}{1 + \frac{E_{sat,TE}}{P_{TE}}} \quad (17)$$

$$\Delta N = \frac{N' - N_{0,TM}}{1 + \frac{E_{sat,TM}}{P_{TM}}} \quad (18)$$

That is, when the following formula (19), which is obtained by assuming that the right side of the formula (17) is equal to that of the formula (18), is satisfied, there may be realized a state in which the modulation factor of the optical absorption coefficient, which is generated in the saturable absorption region 32, does not depend on the plane of polarization of the input optical signal.

$$\frac{N' - N_{0,TE}}{1 + \frac{E_{sat,TE}}{P_{TE}}} = \frac{N' - N_{0,TM}}{1 + \frac{E_{sat,TM}}{P_{TM}}} \quad (19)$$

From the calculation results shown in FIGS. 7A through 7D, which will be described later, $N_{0,\ TE}$ may be made almost equal to $N_{0,\ TM}$ in the extension-strain quantum well. Accordingly, the formula (19) may be expressed in the following formula (20).

$$\frac{E_{sat,TE}}{\exp(\sqrt{\ }_{TE} g_{TE} L_g)} = \frac{E_{sat,TM}}{\exp(\sqrt{\ }_{TM} g_{TM} L_g)} \quad (20)$$

The meaning of the formula (20) will be described as follows: That is, the absorption saturation energy $E_{sat,\ TM}$ for the TM polarization is required to be set smaller than the absorption saturation energy $E_{sat,\ TE}$ for the TE polarization. It is found from the above-described formulae (11) and (12) that the formula (5) is required to be satisfied in order to satisfy the formula (20) because the absorption saturation energy for the TE polarization is proportional to the differential gain $A_{TE}$, and the absorption saturation energy for the TM polarization is proportional to the reciprocal of $A_{TM}$. That is, it is found that the differential gain in the saturable absorption region 32 for the TM polarization is required to be set larger than that for the TE polarization.

The carrier-density dependence of a material gain and a differential gain for light with a wavelength of 1.53 μm in the single-quantum well structure shown in FIGS. 6A through 6D will be explained, referring to FIGS. 7A through 7D. The horizontal axis indicates the carrier density graduated in $cm^{-3}$, the vertical axis on the left side represents the material gains graduated in $cm^{-1}$, and the vertical axis on the right side shows the differential gains graduated in $cm^2$.

Figure 7A:
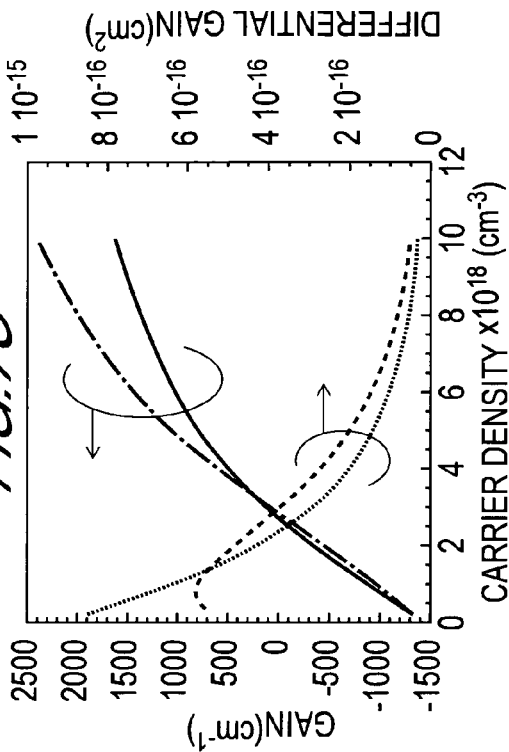
FIG. 7A is a view showing carrier-density dependence of a material gain and a differential gain.
Figure 7B:
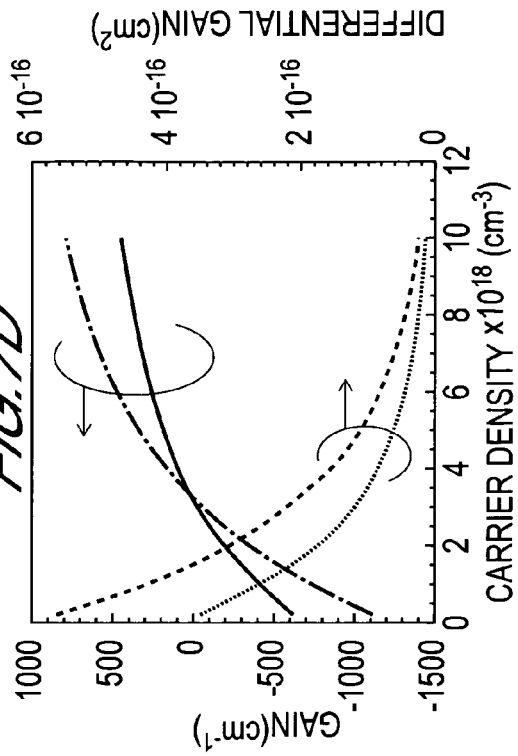
FIG. 7B is a view showing carrier-density dependence of a material gain and a differential gain.
Figure 7C:
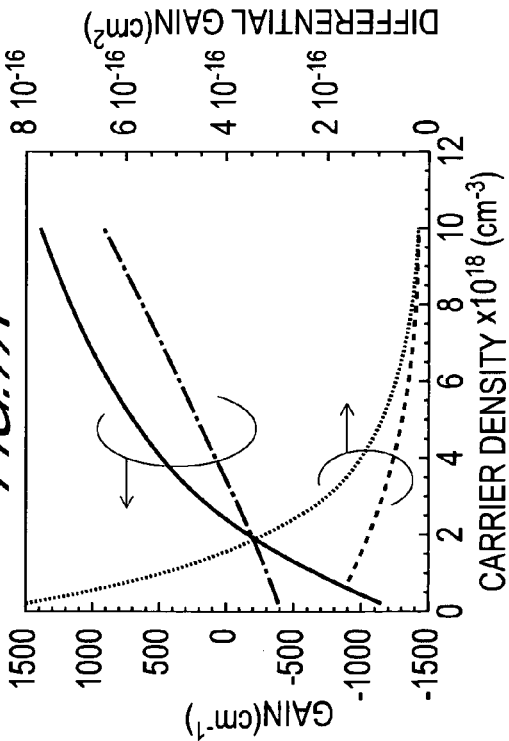
FIG. 7C is a view showing carrier-density dependence of a material gain and a differential gain.
Figure 7D:
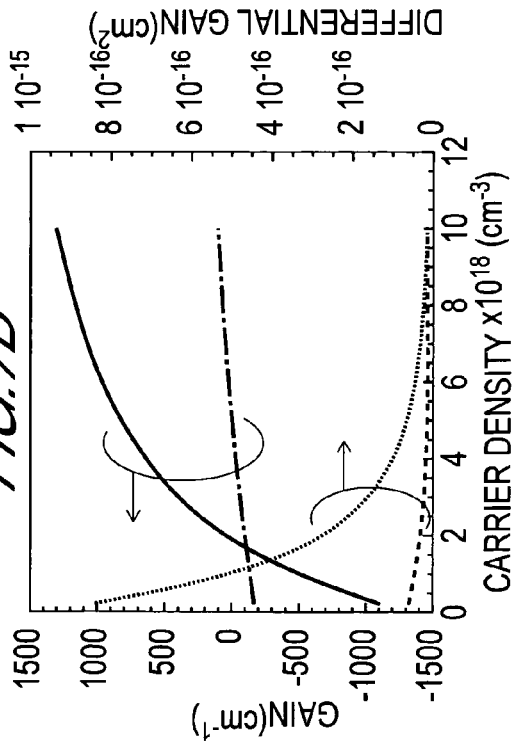
FIG. 7D is a view showing carrier-density dependence of a material gain and a differential gain.

The material gain and the differential gain are calculated, changing the strain introduced into the quantum well layer, to obtain the following results: FIG. 7A for a case of no introduced strain; FIG. 7B for a case in which –0.5% compression strain is introduced; FIG. 7C for a case in which 0.25% extension strain is introduced; and FIG. 7D for a case in which 0.58 extension strain is introduced. Moreover, in a similar manner to that of FIGS. 6A through 6D, band gap wavelengths and various kinds of parameters of the quantum well layer for the above calculations have been set as shown in Table 1 which has been described above.

The solid lines show the material gains for the TE mode, and the fine dashed lines represent the differential gains for the TE mode. Moreover, the dotted and dashed lines show the material gains for the TM mode, and the dashed lines represent the differential gains for the TM mode. As shown in FIGS. 7A and 7B, the material gains for the TE mode are larger than those for the TM mode in a region in which the carrier density is sufficiently high when there is not introduced the strain, or the compression strain is introduced in the quantum well. On the other hand, it is found from FIGS. 7C and 7D that the material gains for the TM mode may be larger than those for the TE mode in a region in which the carrier density is sufficiently high when the extension strain is introduced in the quantum well. Accordingly, the above-described formulae (1) and (2) may be satisfied by the quantum well structure in which bulk crystal or moderate extension strain is introduced into the gain region 30.

On the other hand, the differential gains for the TE mode are larger than those for the TM mode as shown in FIGS. 7A and 7B when there is not introduced the strain, or the compression strain is introduced in the quantum well. Furthermore, it is found from FIGS. 7C and 7D that the differential gains for the TM mode may be larger than those for the TE mode when the extension strain is introduced in the quantum well. Accordingly, the above-described formula (5) may be satisfied, that is, the condition, $E_{sat,\ TE} > E_{sat,\ TM}$, that the absorption saturation energy for the TM mode $E_{sat,\ TM}$ is smaller than that for the TE mode $E_{sat,\ TE}$ may be satisfied by adopting the quantum well structure introducing moderate extension strain for the saturable absorption region 32.

Moreover, when the quantum well structure introducing the extension strain is adopted for both of the optical waveguides in the gain region 30 and in the saturable absorption region 32, there is a possibility, when the amount of the strain in the gain region 30 is too large, that the above-described formula (1) may not be satisfied. Accordingly, the amount of the strain which should be introduced into the quantum well forming the optical waveguide in the gain region 30 is required to sufficiently be small in such a way that the formulae (1) and (2) are satisfied, and the amount of the strain which should be introduced into the quantum well forming the optical waveguide in the saturable absorption region 32 is required to sufficiently be large in such a way that the formula (5) is satisfied.

As described above, the MLLD according to the present invention is required to have a configuration in which the optical waveguide forming the gain region and that forming the saturable absorption region form the quantum well structure with the different amount of strain from each other, or are formed with a material such as bulk crystal or quantum well crystal, different from each other. A technology by which separate regions in one element have quantum well structures with different amount of strain from one another, or are formed with materials with different configurations, for example, bulk crystal or quantum-well crystal as described above has been already established so far as one of technologies which realize a distributed Bragg reflector type semiconductor laser, and an external modulator integrated type semiconductor laser. The optical waveguide in the gain region and that in the saturable absorption region may be formed through a process, respectively, wherein, for example, during the process, an epitaxial layer forming the optical waveguide in the gain region is formed on the semiconductor substrate, subsequently, a part of the epitaxial layer is removed by etching, and the epitaxial layer forming the optical waveguide in the saturable absorption region is formed on a region in which the part is removed.

Moreover, the formula (19), that is, the formula (20) may be also satisfied by adjusting the length $L_g$ of the gain region in addition to by adjusting the amount of the strain of the strained quantum well forming the optical waveguides in the gain region and in the saturable absorption region, as understood from a configuration in which the parameter $L_g$, which gives the length of the gain region, is included in the formula (20).

Moreover, time is neglected in the process deriving the formulae (19) and (20), wherein, during the time, at a point when an optical pulse forming the input optical signal does not exist, the values of the optical gains and those of the optical absorption coefficients in the gain region and the saturable absorption region recover to those in a state before the optical pulse is input. That is, as the life of a carrier excited by an optical pulse forming the input optical signal is limited, finite time is required before the value of an optical gain and that of an optical absorption coefficient recover. Therefore, a phenomenon called pattern effects actually occurs, or multi modulation effects and the like are generated, wherein the multi modulation effects is generated by orbiting of the optical pulse forming the input optical signal in the resonator of the MLLD. These phenomena and the effects are neglected to derive the formulae (19) and (20).

Accordingly, when there are generated the pattern effects, the multi modulation effects, and the like, setting to satisfy the formulae (19) and (20) does not become a condition under which the MLLD is operated without dependence of the input optical signal on the polarization. However, even in the above case, the intensity of the modulation factor of the optical absorption caused in the saturable absorption region may be independent of the plane of polarization of the input optical signal by adjusting the length $L_g$ and the like of the gain region while the formulae (1), (2), and (5) are satisfied.

(B) Control of the Resonance Effect.

As explained above, the optical clock signal may be extracted without depending on the direction of the polarization of the input optical signal when the MLLD is formed in such a way that the formulae (1), (2), and (5) are satisfied. That is, when the MLLD, which satisfies the formulae (1), (2), and (5), is used, there is realized the optical clock signal extracting device by which the optical clock signal may be extracted without depending on the direction of the polarization of the input optical signal.

However, it is not completely guaranteed only by using the MLLD which is set to satisfy the formulae (1), (2), and (5) to drive the optical clock signal extracting device without depending on the direction of the polarization of the input optical signal. In order to reliably drive the optical clock signal extracting device without depending on the direction of the polarization of the input optical signal, it is required to examine the effect of resonance, which will be explained hereinafter.

It is temporally assumed that the MLLD makes the TE mode oscillation. It is assumed that the input optical signal of the TE polarization is input to the MLLD under the TE mode oscillation, and that the wavelength of the input optical signal satisfies the resonance condition for the MLLD. In this case, higher degree of optical absorption modulation is made because the input optical signal is resonated within the resonator of the MLLD. That is, an optical clock signal may be effectively extracted even in a state in which the intensity of the input optical signal is low.

On the other hand, when the input optical signal of the TM polarization with the same wavelength as that of the TM mode is input, there is not generated the optical absorption modulation caused by resonance because the MLLD does not oscillate in the TM mode. That is, when the input optical signal of the TM polarization is input the intensity of the input optical signal is required to sufficiently be large in comparison with that of the input optical signal of the TM polarization in order to extract the optical clock signal.

As described above, the resonance effect is defined as an effect which is obtained when a higher degree of modulation of the optical absorption is realized by a resonance phenomenon in the resonator, wherein the phenomenon is occurred when the oscillation mode of the MLLD and the polarization mode of the input optical signal are in agreement with each other.

The present inventors have conducted the following experiments in order to confirm the resonance effect. That is, there have been conducted the experiments in which a train of optical pulses with a repetition frequency of approximately the same orbiting frequency as that of a conventional type of MLLD were injected into the conventional type of MLLD and it was confirmed to what degree time jitters were reduced, wherein the strained quantum well into which the compression strain was introduced was formed in the conventional type of MLLD as the optical waveguides in the gain region and the saturable absorption region. Here, the orbiting frequency of the conventional MLLD, which was used in the experiments, was 40 GHz, and the repetition frequency of the optical pulses in the injected train of optical pulses also was 40 GHz in the experiments. This injected train of optical pulses are also called a master train of optical pulses.

In the experiment, the center wavelength of the optical pulses forming the master train of optical pulses was changed, and changes in the time jitters of the MLLD were observed. In the experiment, the polarization for the master train of optical pulses was set to be the TE one. Moreover, the light intensity of the master train of optical pulses injected into the MLLD was set at −13 dBm in the experiment.

Figure 8:
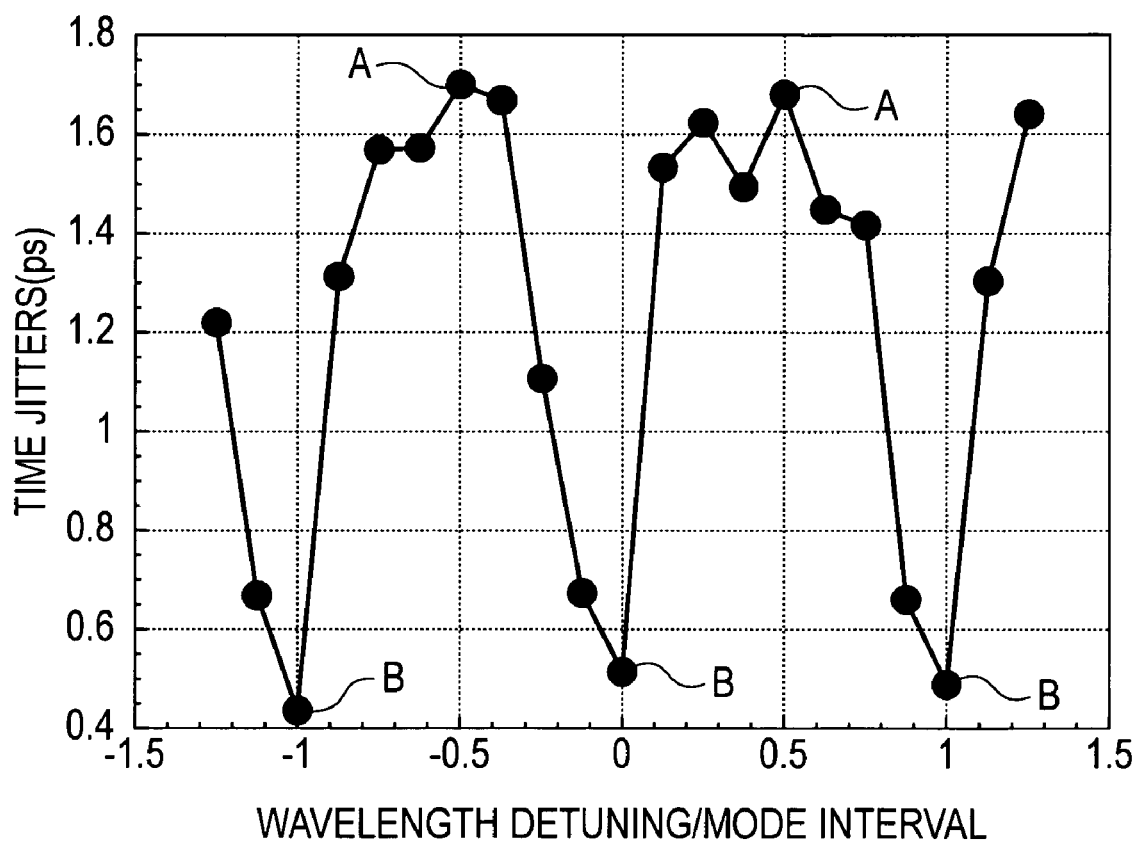
FIG. 8 is a view showing the characteristics of time jitters to the ratio of wavelength detuning and mode interval.
Figure 9A:
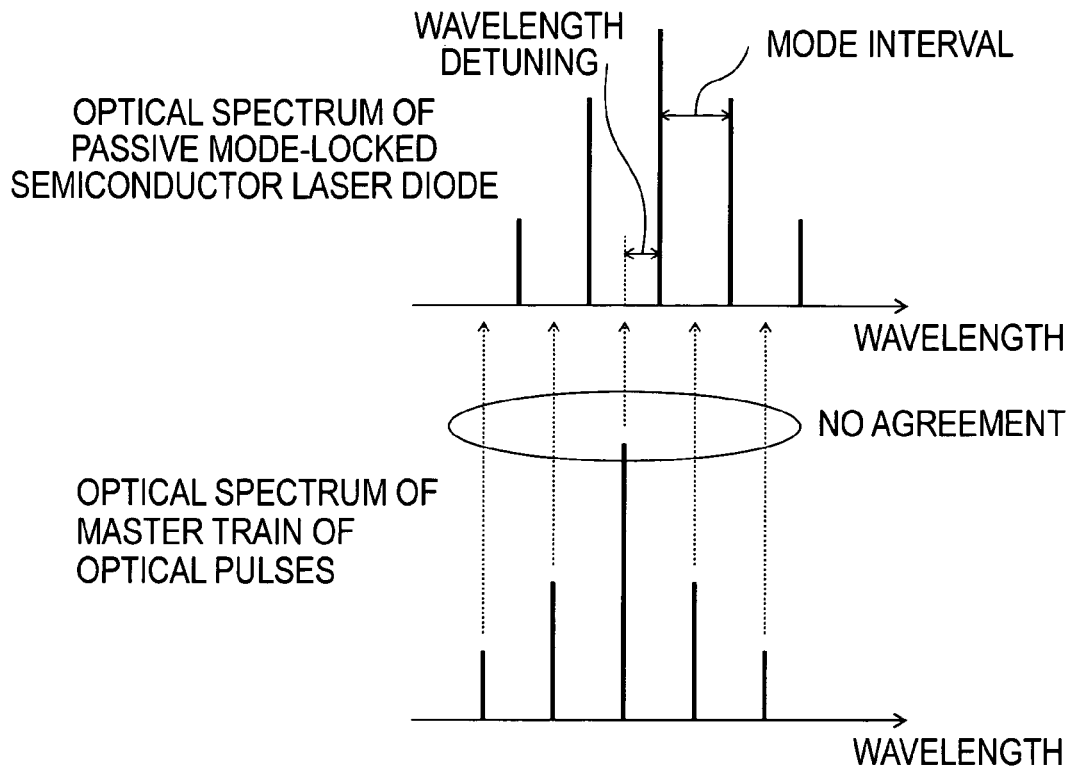
FIG. 9A is a view explaining the operation principle of passive mode-locking.
Figure 9B:
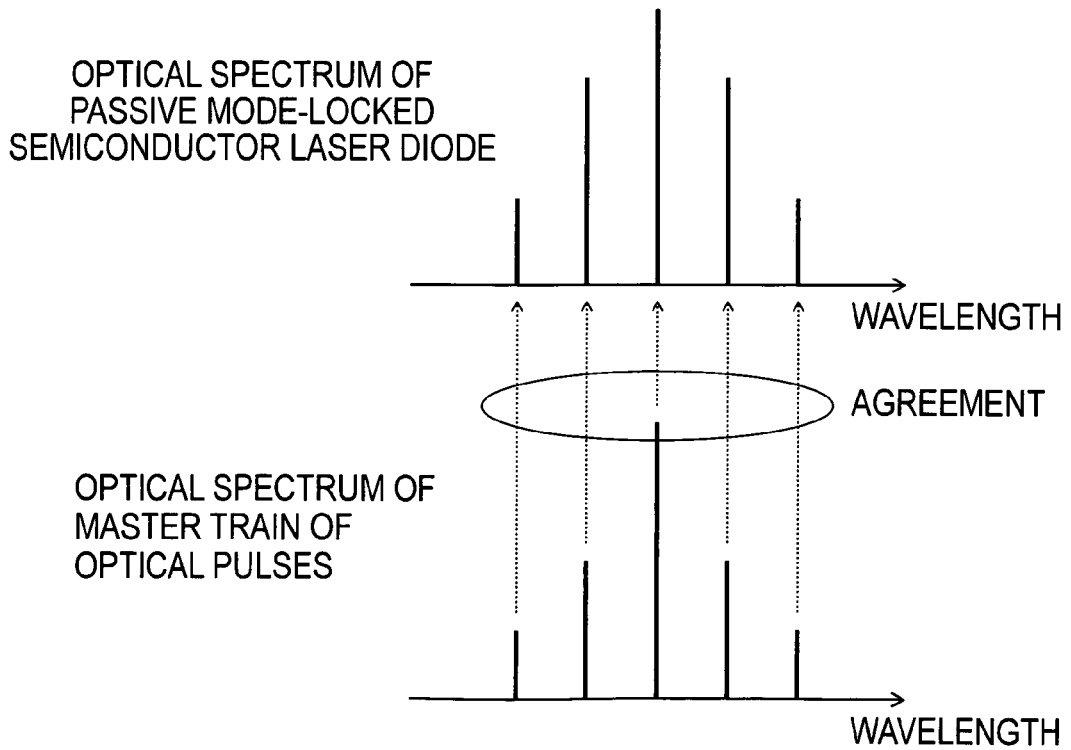
FIG. 9B is a view explaining the operation principle of passive mode-locking.

The above-described experiment results will be explained, referring to FIG. 8, and FIGS. 9A and 9B. FIG. 8 is a view showing the characteristics of the time jitters to the ratio of the wavelength detuning and the mode interval. In FIG. 8, the horizontal axis indicates the amount of changes in the wavelength, that is, an amount which is obtained by division of the amount of the wavelength detuning by the mode interval, and the vertical axis represents the time jitters of the passive mode-locked semiconductor laser diode and is graduated in ps. Moreover, FIGS. 9A and 9B explain the principle of the passive mode-locked operation. In FIGS. 9A and 9B, the wavelength is expressed on the horizontal axis in an arbitrary scale. Moreover, the vertical axis is eliminated, but the light intensity is expressed on the vertical axis in an arbitrary scale.

When an amount, which is shown in FIG. 8 and is obtained by division of the amount of the wavelength detuning by the mode interval, takes an integer value, it is meant that the master train of optical pulses satisfy the resonance condition of the MLLD.

FIG. 9A shows a case in which the optical spectrum, that is, the oscillation spectrum of the MLLD is not in agreement with the optical spectrum of the master train of optical pulses. Moreover, FIG. 9B shows a case in which the optical spectrum, that is, the oscillation spectrum of the MLLD is in agreement with the optical spectrum of the master train of optical pulses. In FIG. 8, an observed value denoted by A is a value for time jitters observed when the oscillation spectrum of the MLLD and the optical spectrum of the master train of optical pulses are not in agreement with each other, that is, the observed value is corresponding to a state shown in FIG. 9A. Moreover, an observed value denoted by B is a value for time jitters observed when the oscillation spectrum of the MLLD and the optical spectrum of the master train of optical pulses are in agreement with each other, that is, the observed value is corresponding to a state shown in FIG. 9B.

When the optical spectrum of the master train of optical pulses and the oscillation spectrum of the MLLD are in agreement with each other, that is, when the oscillation condition of the MLLD is satisfied, a value for the time jitters takes the smallest one as shown in FIGS. 8, 9A and 9B. That is, the above circumstance means that the optical clock signal may be extracted in the state in which the intensity of the train of optical pulses injected into the MLLD is the smallest.

It is found from these experiment results that extraction of the optical clock signal is largely influenced by whether there occurs the resonance effect caused by the master train of optical pulses in the MLLD. As the resonance effect is not obtained when the input optical signal of the TM polarization is input to the MLLD, it is found that no generation of the above resonance effect is required in order to realize that the extraction of the optical clock signal does not depend on the polarization of the input optical signal. That is, it is found that it is required to drive the MLLD in a state in which any of longitudinal-mode oscillation wavelengths of the extracted optical clock signal are not in accordance with a peak wavelength in the frequency spectrum of the input optical signal.

The above-described formula (6) is a condition which prevents the resonance effect from being generated, and, in a state completely independent of the direction of the polarization of the input optical signal, the optical clock signal may be extracted by driving the MLLD while the above condition is satisfied. Moreover, the MLLD functions at far high speed in comparison with that of a clock signal extracting device including electric elements electrically driven. Accordingly, the optical clock signal may be extracted without depending on the polarization of this input optical signal from the input optical signal with a high bit rate of exceeding 40 Gbit/s according to the first and the second optical clock signal extracting devices.

<MLLD According to a Second Invention>

Figure 10A:
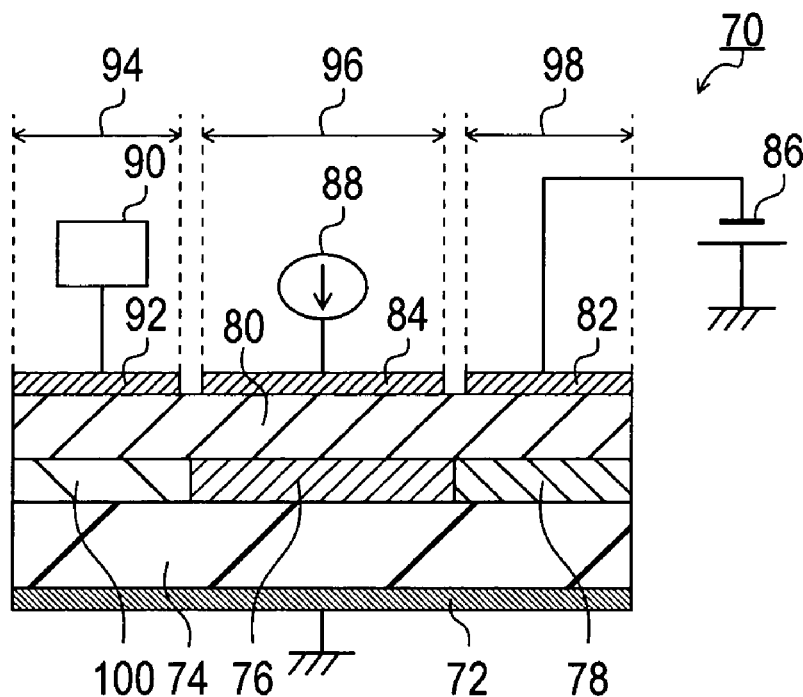
FIG. 10A is a schematic and structural view of an MLLD according to a second aspect of the invention.
Figure 10B:
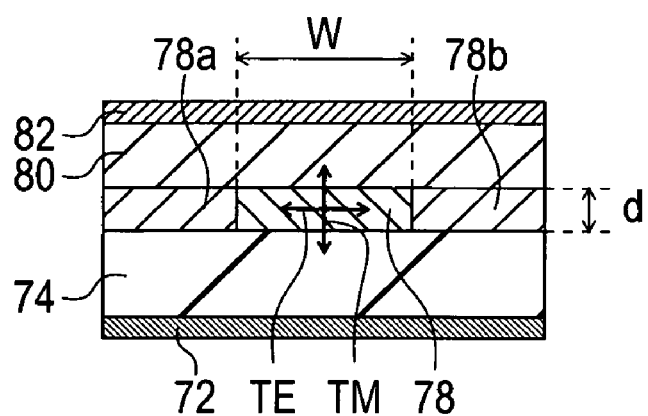
FIG. 10B is a schematic and structural view of the MLLD according to the second aspect of the invention.

The structure of an MLLD according to the second invention will be explained, referring to FIGS. 10A and 10B. FIG. 10A is a schematic and structural side view of the MLLD 70 according to the second invention, seen from a direction perpendicular to the optical waveguide direction, and FIG. 10B is a schematic and structural view of the MLLD 70 seen from a direction opposing to the direction of the optical waveguide.

The MLLD 70 includes a passive waveguide region 94 with a variable effective-refractive-index, a gain region 96 in which a population inversion is formed, and a saturable absorption region 98 with a function modulating light intensity, and is a semiconductor laser in which the passive waveguide region 94, the gain region 96, and the saturable absorption region 98 are arranged in series. Here, the structures of the gain region 96, the saturable absorption region 98 and the conditions which are satisfied thereby are the same as those of the gain region 30 and the saturable absorption region 32, which are described above, in the MLLD 10 according to the first invention.

The MLLD 70 is different from the above-described MLLD 10 according the first invention in a point that the MLLD 70 is provided with the passive waveguide region 94 in addition to the gain region 96 and the saturable absorption region 98. A current is injected or a reverse-bias voltage is applied from a constant current source, or a constant voltage source to the passive waveguide region 94 through a p-type electrode 92 and an n-type common electrode 72. As either of a constant current or a constant voltage may be supplied to the passive waveguide region 94, the constant current and the constant voltage are united together with each other into a power supply 90 in the present explanation.

Moreover, a current is injected from a constant current source 88 to the gain region 96 through a p-type electrode 84 and an n-type common electrode 72, and a reverse-bias voltage is applied from a constant voltage source 86 to the saturable absorption region 98 through the p-type electrode 82 and the n-type common electrode 72.

An optical waveguide 100 existing in the passive waveguide region 94 (hereinafter, called "optical waveguide 100" in some cases), an optical waveguide 76 existing in the gain region 96 (hereinafter, called "optical waveguide 76" in some cases), and an optical waveguide 78 existing in the saturable absorption region 98 (hereinafter, called "optical waveguide 78" in some cases), are configured to be sandwiched between a common first clad layer 74 and a second clad layer 80. Here, it is assumed that the first clad layer 74 is an n-type clad layer, and the second clad layer 80 is an p-type clad layer. A crystalline material forming the optical waveguides 76 and 78 is decided according to the wavelength of the input optical signal input to the MLLD 70. When the wavelength of the above input optical signal is in, for example, a 1.5 µm band, InP system semiconductor crystalline material, or a quantum well structure using an InP system semiconductor crystalline material is used.

The shape of the optical waveguide 76 and that of the optical waveguide 78 as shown in FIG. 10B is a rectangular one with a width of w and a thickness of d as shown in FIG. 10B. Clad layers 78a and 78b are formed on both sides of the optical waveguide 78. FIG. 10B is a view seen from the side of the saturable absorption region 98. Accordingly, the end surface of the optical waveguide 78 may be seen.

It is assumed that the direction of the plane of polarization of the input optical signal, that is, the direction of the plane of polarization of light propagating in the optical waveguides 76 and 78 is parallel (the horizontal direction in FIG. 10B) to the width direction of these optical waveguides in the TE polarization, and is parallel (the vertical direction in FIG. 10B) to the thickness direction of these optical waveguides in the TM polarization.

Here, it is assumed that the optical waveguide 76 in the gain region 96 is formed with bulk crystal, or with the quantum well structure introducing the extension strain. Explanation will be made, assuming that the oscillation mode of the MLLD 70 is the TE mode. Hereinafter, in a similar manner to that of the above-described MLLD 10 according to the first invention, laser oscillation operation in which oscillation light is the TE polarization is called the TE mode operation, and the waveguide mode of oscillation light in the optical waveguides 76 and 78 is called the TE mode in some cases. Similarly, laser oscillation operation in which oscillation light is the TM polarization is called the TM mode operation, and the waveguide mode of oscillation light in the optical waveguides 76 and 78 is called the TM mode in some cases.

As the condition (the above-described first condition) that the optical gain for the TE mode is larger than that for the TM mode in the gain region 96, and the condition (the above-described second condition) that the absorption saturation energy for the TM mode is smaller than that for the TE mode in the saturable absorption region 98 are the same as those of the above-described MLLD 10 according to the first invention, the explanation will be eliminated.

Figure 11:
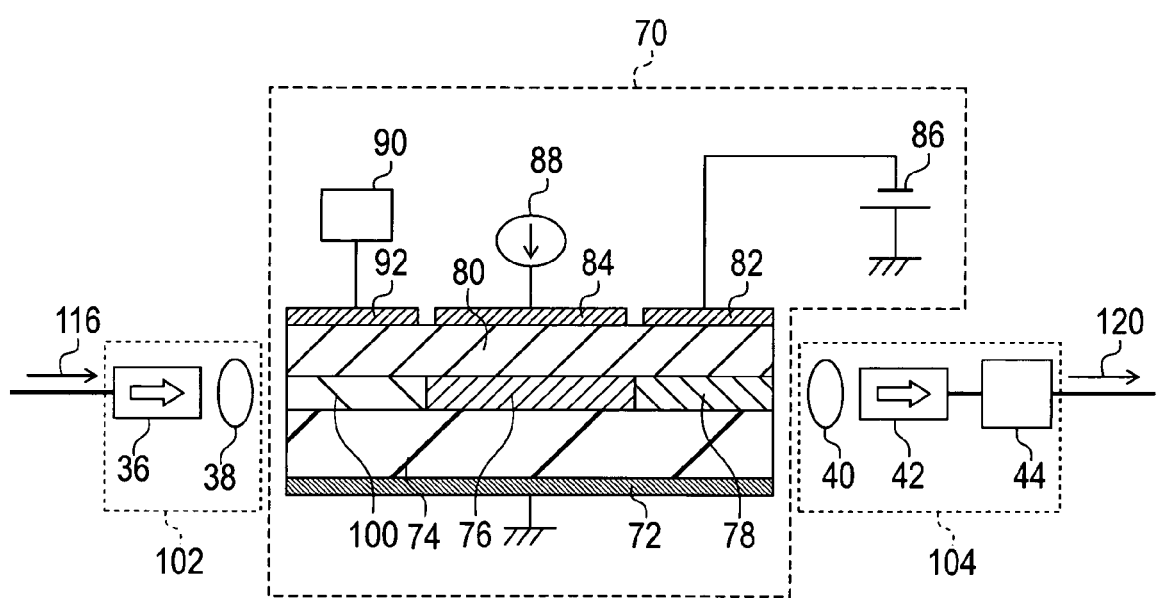
FIG. 11 is a schematic and structural view of a first optical clock signal extracting device using the MLLD according to the second aspect of the invention.

The configuration of a first optical clock signal extracting device using the MLLD 70 according to the second invention will be explained, referring to FIG. 11. The first optical clock signal extracting device shown in FIG. 11 is configured to be provided with the MLLD 70, an input portion 102 inputting an optical signal 116, and an output portion 104 outputting an optical clock signal 120 extracted from this input optical signal 116 by the MLLD 70.

As the input portion 102 has the same structure as that of the input portion 34, shown in FIG. 2, of the first optical clock signal extracting device using the MLLD 10 according to the first invention, and the output portion 104 has the same structure as that of the output portion 46, shown in FIG. 2, of the first optical clock signal extracting device using the MLLD 10 according to the first invention, the explanation will be eliminated.

Though the basic operation of a first optical clock signal extracting device using the MLLD 70 according to the second invention is similar to that of the first optical clock signal extracting device using the MLLD 10 according to the first invention, the difference between the device using the MLLD 70 and the device using the MLLD 10 is in a point that the length of a resonator in the MLLD 70 may be easily changed by a configuration in which the MLLD 70 according to the second invention is provided with the passive waveguide region 94. In order to prevent the above-described resonance effect from being generated, the MLLD may be driven by changing the length of the resonator in the MLLD 70 in a state in which any of longitudinal-mode oscillation wavelengths of the extracted optical clock signal are not in accordance with a peak wavelength in the frequency spectrum of the input optical signal.

Assuming that the length of the resonator is L, and the average effective-refractive-index of the resonator is n, the resonance condition of the laser is given by the following formula (21):

$$2nL = m\lambda \quad (21)$$

Where m is a natural number.

In the MLLD 70 according to the second invention, the resonators are the optical waveguides 100, 76, and 78, and the average effective refractive index n is an average of the effective refractive indexes of these optical waveguides.

Here, assuming that the repetition frequency of the MLLD is 40 GHz, L is about 1 mm. Under this condition, when the oscillation wavelength of the MLLD is 1.55 µm, a change of 0.1 µm in the length of the resonator causes a change of 0.155 nm in the resonating wavelength for the same m value according to the conditional formula (21). As the longitudinal-mode interval of this MLLD is 0.32 nm, the above changed amount of 0.155 nm corresponds to about half the size of the longitudinal mode interval.

A general technique for forming a resonator in a semiconductor laser is a method for forming the resonator by cleaving. According to the technique for forming the resonator by cleaving, the length of the resonator cannot be formed within an error of about 20 µm or less. Accordingly, it is very difficult to form the length of the MLLD in the resonator with good accuracy in such a way that the above-described change of 0.1 µm presents no problem. That is, it is meant that it is extremely difficult to satisfy the above-described formula (6) at any time by manufacturing the MLLD according to the common technique forming the resonator by cleaving.

The MLLD 70 according to the second invention is provided with the passive waveguide region 94 in order to solve the problem that it is difficult to satisfy the above-described formula (6) at any time. A current is injected or a constant voltage is applied from the power supply 90 to the passive waveguide region 94 through the p-type electrode 92 and the n-type common electrode 72. When the current is injected, the effective refractive index of the optical waveguide 100 is changed by a plasma effect. Moreover, when the constant voltage is applied, the effective refractive index of the optical waveguide 100 is similarly changed by a Pockels effect.

The length of the resonator in the MLLD 70 may be controlled by changing the effective refractive index of the optical waveguide 100. As the resonator of the MLLD 70 includes the optical waveguides 100, 76, and 78, the length of the resonator in the MLLD 70 may be obviously controlled by changing the effective refractive index of the optical waveguide 100.

Figure 12A:
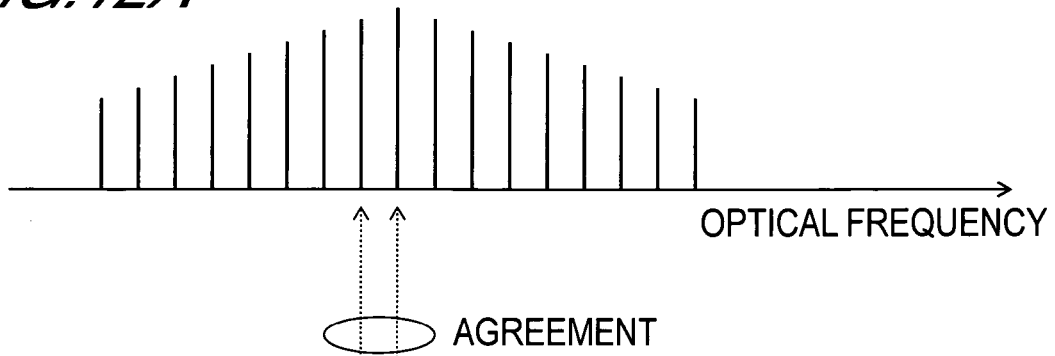
FIG. 12A is a view explaining the operation principle for extracting an optical clock signal by the MLLD according to the second aspect of the invention.
Figure 12B:
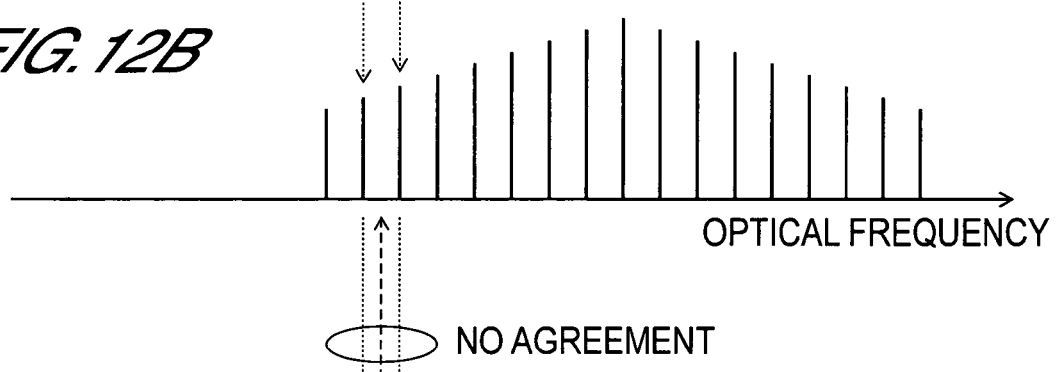
FIG. 12B is a view explaining the operation principle for extracting the optical clock signal by the MLLD according to the second aspect of the invention.
Figure 12C:
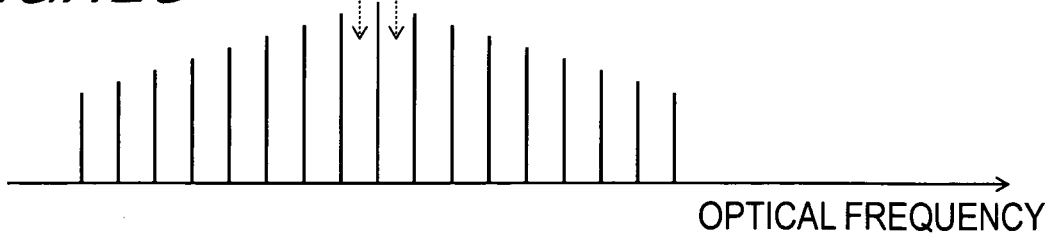
FIG. 12C is a view explaining the operation principle for extracting the optical clock signal by the MLLD according to the second aspect of the invention.

Control of the length of the above-described resonator will be explained, referring to FIGS. 12A, 12B, and 12C. In FIGS. 12A through 12C, the optical frequency is expressed on the horizontal axis in an arbitrary scale, and the vertical axis is eliminated, but the light intensity is expressed on the vertical axis in an arbitrary scale. FIG. 12A shows the longitudinal-mode oscillation spectrum of the MLLD 70. FIG. 12B shows the frequency spectrum of the input optical signal. Now, it is assumed that the longitudinal-mode oscillation spectrum of the MLLD 70 and the frequency spectrum of the input optical signal are in agreement with each other as shown in FIGS. 12A and 12B. In this case, it becomes difficult to extract the optical clock signal without depending on the polarization of the input optical signal because there occurs the resonance effect caused by the input optical signal in the MLLD 70 as described above.

Then, it is required to control the length of the resonator in the MLLD 70. FIG. 12C shows a state in which the longitudinal-mode oscillation spectrum of the MLLD 70 is changed from the longitudinal-mode oscillation spectrum shown in FIG. 12A by controlling the length of the resonator in the MLLD 70. Thus, the condition that the MLLD is driven in a state in which any of longitudinal-mode oscillation wavelengths of the extracted optical clock signal are not in accordance with a peak wavelength in the frequency spectrum of the input optical signal in order to extract the optical clock signal without depending on the polarization of the input optical signal may be easily satisfied by controlling the length of the resonator in the MLLD 70.

That is, according to the second invention, driving the MLLD 70 under a state in which the condition shown in the formula (6) is satisfied at any time may be easily realized, and the optical clock signal may be extracted without depending on the polarization of the input optical signal, even when there are variations in the length of the resonator after the MLLD 70 is manufactured according to usual manufacturing processes. Moreover, even when the wavelength of the input optical signal is changed, it may be guaranteed the optical clock signal may be extracted without depending on the polarization of the input optical signal, because the length of the resonator in the MLLD 70 may be similarly adjusted according to the change in the wavelength even when the wavelength of the input optical signal is changed.

Moreover, it is obvious that it is also possible to form the second optical clock signal extracting device by using the MLLD 70 according to the second invention, though the configuration and the operation of the first optical clock signal extracting device using the MLLD 70 according to the second invention have been explained, referring to FIG. 11. The first optical clock signal extracting device and the second optical clock signal extracting device are different from each other in a point that the first one is configured to be provided with the input portion and the output portion, and that the second one is configured to include the input-output portion. Accordingly, it is obvious that the advantage obtained by the MLLD 70 according to the second invention, by which the basic operation for extraction of the optical clock signal is executed, may be similarly obtained even in the first and the second optical clock signal extracting devices.

<Third Optical Clock Signal Extracting Device>

Figure 13:
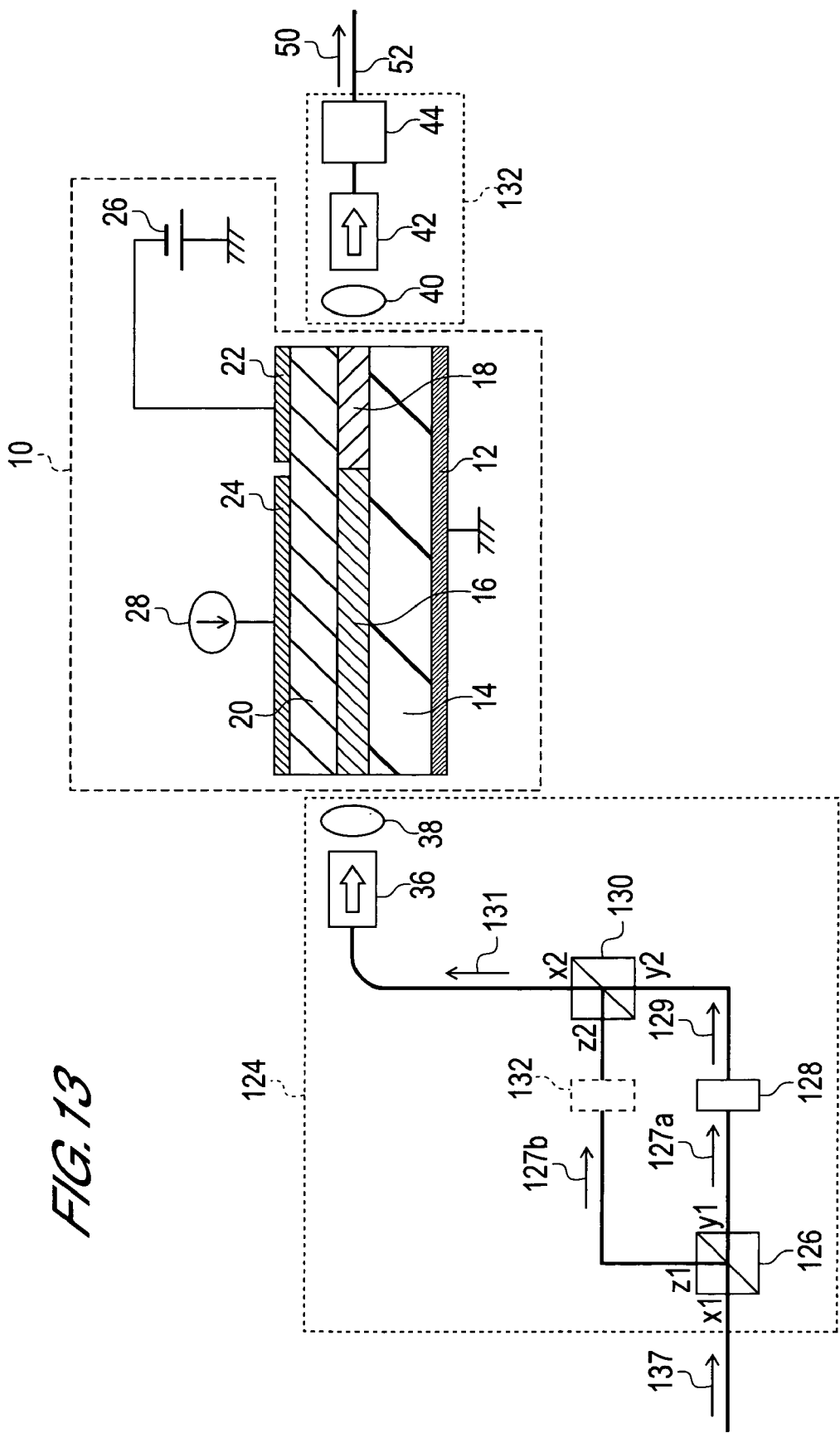
FIG. 13 is a schematic and structural view of a third optical clock signal extracting device using the MLLD according to the first aspect of the invention.

The configuration and the operation of a third optical clock signal extracting device will be explained, referring to FIG. 13. FIG. 13 is a schematic and structural view of the third optical clock signal extracting device using the MLLD 10 according to the first invention. Though the third optical clock signal extracting device using the MLLD 10 according to the first invention is shown in FIG. 13, it is obvious that the MLLD 70 according to the second invention, instead of the MLLD 10 according to the first invention, may be used as one component of the third optical clock signal extracting device. In this case, the above-described advantage obtained by the MLLD 70 according to the second invention, by which the optical clock signal is extracted as the basic operation, may be obtained.

In a similar manner to that of the above-described first optical clock signal extracting device, the third optical clock signal extracting device using the MLLD 10 is provided with the MLLD 10, an input portion 124 for input of an optical signal 137, and an output portion 132 for output of an optical clock signal 50 extracted from the input optical signal 137 by the MLLD 10. However, the configuration of the input portion 124 is different from that of the above-described first optical clock signal extracting device.

The input portion 124 of the third optical clock signal extracting device is provided with a first polarization separating and coupling device 126, an optical attenuator 128, a second polarization separating and coupling device 130, and a first coupling optical system 38. The first polarization separating and coupling device 126 separates the input optical signal 137 into a first input optical signal 127a and a second input optical signal 127b. The optical attenuator 128 adjusts the strength of the first input optical signal 127a, and the signal is output as a first adjusted input optical signal 129. The second polarization separating and coupling device 130 couples the first adjusted input optical signal 129 output from the optical attenuator 128 and the second input optical signal 127b, and the coupled signals are output as an adjusted input optical signal 131. The first coupling optical system 38 outputs an adjusted input optical signal 131 output from the second polarization separating and coupling device 130 to the MLLD 10.

The input portion 124 of the third optical clock signal extracting device is provided with the above-described first polarization separating and coupling device 126, the optical attenuator 128, the second polarization separating and coupling device 130, and the first coupling optical system 38, and further includes a first optical isolator 36 which prevents returning light from being input to an optical transmission line 138 transmitting the input optical signal 137.

As the output portion 132 has the same configuration as that of the output portion 46 of the first optical clock signal extracting device shown in FIG. 2, the explanation will be eliminated.

Even in any of the first, the second, and the third optical clock signal extracting devices, the object that the optical clock signal is extracted without depending on the polarization state of the input optical signal is achieved by a configuration in which the modulation intensity of the optical absorption coefficient, which is generated in the saturable absorption region, does not depend on the polarization of the input optical signal, based on the conditions given by the formulae (1), (2), (6), (19), and (20).

However, as predicted from the calculation results shown in FIG. 3 and FIGS. 4A and 4B, a required condition for satisfying the formula (19) or (20) depends on the length $L_g$ of the gain region and the wavelength of the input optical signal. In some cases, there is caused a case in which the formula (19) or (20) does not hold when there are variations in the gain region and the absorption saturation energy, wherein the variations are caused by variations in manufacturing the MLLD. Moreover, when the reflection coefficient of the end surface inputting the input optical signal to the MLLD has dependence of the input optical signal on the polarization, an operation by which the optical clock signal is extracted by the MLLD is caused to have dependence of the input optical signal on the polarization state.

Figure 14A:
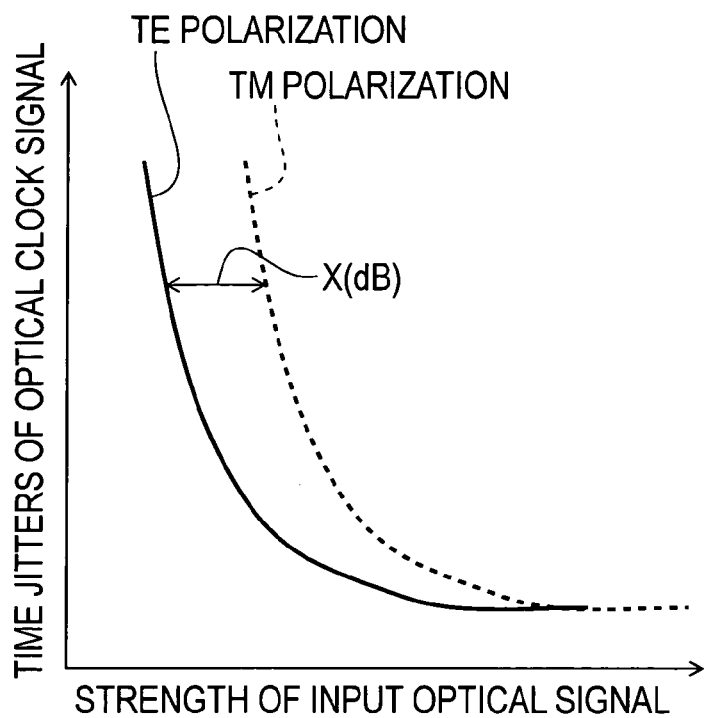
FIG. 14A is a view showing relations between time jitters of an optical clock signal and the strength of an input optical signal.
Figure 14B:
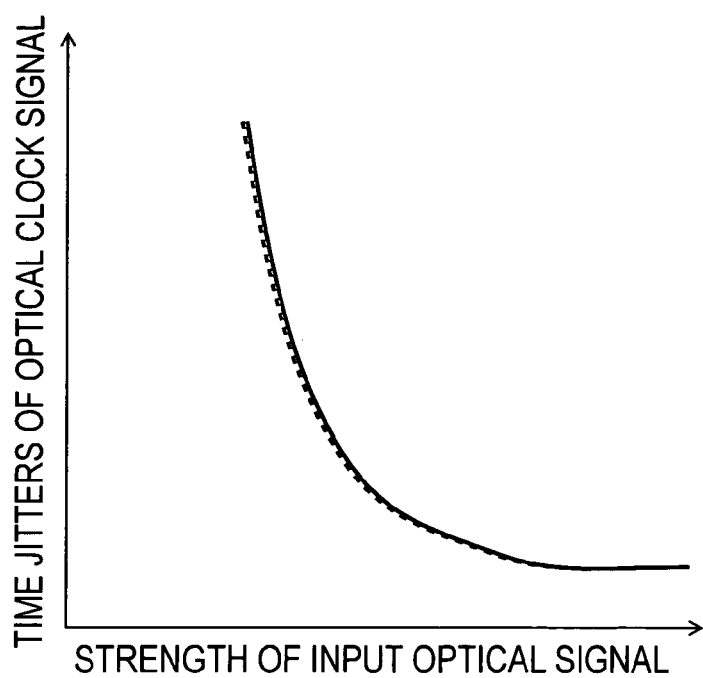
FIG. 14B is a view showing relations between time jitters of an optical clock signal and the strength of an input optical signal.

A case in which the above-described extraction of the optical clock signal has the dependence on the polarization state of the input optical signal will be specifically explained, referring to FIGS. 14A and 14B. FIGS. 14A and 14B are views showing relations between the intensity of the input optical signal and the time jitters of the optical clock signal. In the drawings, the intensity of the input optical signal is expressed on the horizontal axis in an arbitrary scale, and the size of the time jitters of the optical clock signal is expressed on the vertical axis in an arbitrary scale.

In the characteristics of the time jitters in the input intensity of the optical signal input into the MLLD during extraction of the optical clock signal, there are some cases in which the case of the TE polarization of the input optical signal differs in the size of time jitters from that of the TM polarization of the input optical signal as shown in FIG. 14A. FIG. 14A indicates the above state. In the drawing, a curve representing the time jitter characteristics for the TE polarization is shown by a solid line, and a curve representing the time jitter characteristics for the TM polarization is shown by a dashed line. The curve for the TE polarization is translated by XdB in parallel with the curve for the TM polarization along the direction of the horizontal axis.

That is, according to the drawing, the intensity of the input optical signal for the TM polarization is required to be larger than that for the TE polarization by XdB in order to obtain an optical clock signal with an equal time-jitter characteristics. One of reasons that the time jitter characteristics are different from each other between the input optical signal for the TE polarization and that for the TM polarization as shown above is the fact that the reflection coefficient of the end surface inputting the input optical signal to the MLLD has dependence on the polarization.

In order to prevent time jitters from depending on the polarization state, it is required just to adopt a means to attenuate the TE polarization element of the input optical signal by XdB for the TM polarization element and to input the former element into the MLLD. By adopting the above means, the polarization state of the input optical signal, which is input to the MLLD, for the TE polarization, and that for the TE polarization have the same characteristic of the time jitters as shown in FIG. 14B, and the optical clock signals with the same characteristic of time jitters may be extracted.

The means to attenuate the TE polarization element of the input optical signal by XdB for the TM polarization element and to input the former element into the MLLD is realized by the input portion 124 as shown in FIG. 13.

The input optical signal 137 is input to a port x1 of the first polarization separating and coupling device 126, the TE polarization element is output from a port y1, and the TM polarization element is output from a port z1. That is, the input optical signal 137 is separated into the first input optical signal 127a of the TE polarization element and into the second input optical signal 127b of the TM polarization element by the first polarization separating and coupling device 126.

The first input optical signal 127a of the TE polarization element is input to the optical attenuator 128 by which the intensity is attenuated by XdB for adjustment, and is output as the first adjusted input optical signal 129. The first adjusted input optical signal 129 which is of the TE polarization element and has the adjusted intensity is input to a port y2 of the second polarization separating and coupling device 130, and the second input optical signal 127b which is of the TM polarization element is input to a port z2 of the second polarization separating and coupling device 130. Accordingly, the first adjusted input optical signal 129 and the second input optical signal 127b are input to the second polarization separating and coupling device 130 for coupling, and are output from a port x2 of the second polarization separating and coupling device 130 as the adjusted input optical signal 131. The adjustment input optical signal 131 is input to the MLLD 10 by the first coupling optical system 38 through the first optical isolator 36.

As the intensity of the TE polarization element of the input optical signal is attenuated with the optical attenuator 128 by XdB, and the element is input to the MLLD 10 as the first adjusted input optical signal 129, and the optical clock signal is extracted by the MLLD 10, wherein the optical clock signal has the same time-jitter characteristics for the TE polarization element and for the TM polarization element of the input optical signal. That is, according to the MLLD 10, the optical clock signal may be extracted without depending on the polarization state of the input optical signal.

Here, an optical amplifier 132 such as a semiconductor optical amplifier and an optical fiber type amplifier, without limiting to the optical attenuator 128, may be used in order to adjust the intensity of the TE polarization element, though the optical attenuator 128 has been used for that purpose. Though the optical attenuator 128 is provided in the middle of an optical path between the port y1 of the first polarization separating and coupling device 126 and the port y2 of the second polarization separating and coupling device 130, an optical amplifier is provided in the middle (a position numbered 132 shown in FIG. 13 as a rectangle encircled with the dashed lines) of an optical path between the port z1 of the first polarization separating and coupling device 126 and the port z2 of the second polarization separating and coupling device 130 when the optical amplifier 132, instead of the optical attenuator 12, is used.

If the optical clock signal is extracted with the third optical clock signal extracting device, the optical clock signal may be extracted without depending on the polarization even when the synchronization in the passive mode-locked operation of the MLLD itself has the above-described dependence on the polarization state.

Though the configuration and the operation of the third optical clock signal extracting device using the MLLD 10 according to the first invention have been explained, referring to FIG. 13, it is obvious that the third optical clock signal extracting device may be formed, using the MLLD 70 according to the second invention. In this case, it is obvious that the advantage obtained by the MLLD 70 according to the second invention, by which the optical clock signal is extracted as the basic operation, may be similarly obtained in the third optical clock signal extracting device.

The explanations for the operations of the MLLDs according to the first and the second inventions, and those of the first through third optical clock signal extracting devices have been made, assuming that the MLLDs make oscillation of the TE polarization. However, the above-explained operation may be similarly realized even when the MLLD makes oscillation in the TM polarization. In this case, the optical waveguide in the gain region is formed with the extension strained quantum well structure with a large amount of strain, and the laser oscillation is limited to the TM mode. Moreover, the optical waveguide in the saturable absorption region is formed with the extension strained quantum well structure with a small amount of strain, and the absorption saturation energy for the TE polarization is set in such a way that the energy for the TE polarization is smaller than that for the TM polarization.

That is, when TM substitutes for TE, and TE substitutes for TM in the above-described conditional formulae (1), (2), (5), (19), and (20), the above formulae will be applied as they are.

Moreover, a so-called Distributed Bragg Reflector (DBR) laser, which is provided with a distribution type Bragg reflector controlling the oscillation wavelength, may be used as the MLLD. When the DBR laser is used as the MLLD, the following phenomena will occur under limited conditions that antireflection coating of the input-output end surface of the DBR laser is performed, and, furthermore, the wavelength of the input optical signal is sufficiently away from the Bragg wavelength of the Bragg reflector: That is, when the input optical signal is input to the DBR laser which functions as the MLLD, the optical pulse forming this input optical signal passes through the saturable absorption region after passing through the gain region, passes through the gain region again after being reflected by the end surface of the resonator on the side of the saturable absorption region, and reaches the region in which the distribution type Bragg reflector is formed. The optical pulse is output to the outside of the DBR laser functioning as the MLLD without being reflected by the distribution type Bragg reflector after reaching the region in which the distribution type Bragg reflector is formed.

That is, when the DBR laser is used as the MLLD, the optical pulse, forming the input optical signal never resonates in the resonator of the MLLD. Accordingly, when the DBR laser is used as the MLLD, the optical clock signal may be extracted in a stable manner under absence of the resonance effect without depending on the polarization state of the input optical signal even in a case in which the MLLD functions without satisfying the condition defined by the above-described formula (6).

What is claimed is:

1. A passive mode-locked semiconductor laser diode which includes a gain region in which a population inversion is formed, and a saturable absorption region with a function modulating light intensity, and in which said gain region and said saturable absorption region are arranged in series,
   wherein in said gain region, an optical gain for polarization with the plane of polarization in a direction in parallel with the width direction of an optical waveguide which exists in said gain region is larger than an optical gain for polarization with the plane of polarization in a direction in parallel with the thickness direction of the optical waveguide which exists in said gain region, and
   wherein in said saturable absorption region, the absorption saturation energy for the polarization with the plane of polarization in a direction in parallel with the thickness direction of the optical waveguide which exists in said gain region is smaller than the absorption saturation energy for the polarization with the plane of polarization in a direction in parallel with the width direction of the optical waveguide which exists in said saturable absorption region, and,
   a modulation factor for polarization with the plane of polarization in a direction in parallel with the width direction of said optical waveguide which exists in said saturable absorption region is equal to a modulation factor for polarization with the plane of polarization in a direction in parallel with the thickness direction of the optical waveguide which exists in said gain region.

2. A passive mode-locked semiconductor laser diode which includes a passive waveguide region with a variable effective-refractive-index, a gain region in which a population inversion is formed, and a saturable absorption region with a function modulating light intensity, and in which said passive waveguide region, said gain region, and said saturable absorption region are arranged in series,
  wherein in said gain region, an optical gain for polarization with the plane of polarization in a direction in parallel with the width direction of an optical waveguide which exists in said gain region is larger than an optical gain for polarization with the plane of polarization in a direction in parallel with the thickness direction of the optical waveguide which exists in said gain region, and
  wherein in said saturable absorption region, the absorption saturation energy for the polarization with the plane of polarization in a direction in parallel with the thickness direction of the optical waveguide which exists in said gain region is smaller than the absorption saturation energy for the polarization with the plane of polarization in a direction in parallel with the width direction of the optical waveguide which exists in said saturable absorption region; and
  a modulation factor for polarization with the plane of polarization in a direction in parallel with the width direction of said optical waveguide which exists in said saturable absorption region is equal to a modulation factor for polarization with the plane of polarization in a direction in parallel with the thickness direction of the optical waveguide which exists in said gain region.

3. The passive mode-locked semiconductor laser diode according to claim 1,
  wherein an optical waveguide which exists in said gain region is formed with bulk crystal, and an optical waveguide which exists in said saturable absorption region is formed with a quantum well structure into which extension strain is introduced.

4. The passive mode-locked semiconductor laser diode according to claim 1,
  wherein an optical waveguides which exist inside said gain region and said saturable absorption region are formed with a quantum well structure into which extension strain is introduced.

5. An optical clock signal extracting device is provided with:
  the passive mode- locked semiconductor laser diode according to claim 1;
  an input portion which inputs an input optical signal; and
  an output portion which outputs an optical clock signal which has been extracted from said input optical signal by said passive mode-locked semiconductor laser diode.

6. The optical clock signal extracting device according to claim 5,
  wherein said input portion is provided with a first optical isolator which prevents returning light from being input to an optical transmission line transmitting said input optical signal and with a first coupling optical system by which said input optical signal is output to said passive mode-locked semiconductor laser diode.

7. The optical clock signal extracting device according to claim 5,
  wherein said output portion is provided with a second optical isolator which prevents returning light from being input to said passive mode-locked semiconductor laser diode and with a second coupling optical system by which said optical clock signal extracted by said passive mode-locked semiconductor laser diode is output to the input end of an optical transmission line.

8. The optical clock signal extracting device according to claim 5,
  wherein said output portion is provided with a second optical isolator which prevents returning light from being input to said passive mode-locked semiconductor laser diode, a second coupling optical system by which said optical clock signal extracted by said passive mode-locked semiconductor laser diode is output to the input end of an optical transmission line, and a wavelength filter which filters said optical clock signal extracted by said passive mode-locked semiconductor laser diode.

9. An optical clock signal extracting device, comprising:
the passive mode-locked semiconductor laser diode according to claim 1, and
  an input-output portion which inputs an input optical signal, and outputs an optical clock signal extracted from said input optical signal by said passive mode-locked semiconductor laser diode.

10. The optical clock signal extracting device according to claim 9,
  wherein said input-output portion is provided with
  an optical circulator which has a first port for input of said optical signal, a second port for output of said input optical signal and input of said optical clock signal extracted by said passive mode-locked semiconductor laser diode, and a third port outputting said optical clock signal, and
  a coupling optical system which outputs said input optical signal output from said second port to said passive mode-locked semiconductor laser diode, and said optical clock signal extracted by said passive mode-locked semiconductor laser diode to said second port.

11. The optical clock signal extracting device according to claim 9,
  wherein said input-output portion is provided with
  an optical circulator which has a first port for input of said optical signal, a second port for output of said input optical signal and input of said optical clock signal extracted by said passive mode-locked semiconductor laser diode, and a third port outputting said optical clock signal,
  a coupling optical system which outputs said input optical signal output from said second port to said passive mode-locked semiconductor laser diode and said optical clock signal extracted by said passive mode-locked semiconductor laser diode to said second port, and
  a wavelength filter which filters said optical clock signal extracted by said passive mode-locked semiconductor laser diode.

12. The optical clock signal extracting device according to claim 5, wherein said input portion is provided with
  a first polarization separating and coupling device separating an input optical signal into a first input optical signal and a second input optical signal,
  an optical attenuator which adjusts the strength of said first input optical signal and outputs the optical signal as a first adjusted input optical signal,
  a second polarization separating and coupling device which couples said first adjusted input optical signal output from said optical attenuator and said second input optical signal for output as an adjusted input optical signal, and
  a first coupling optical system which outputs said adjusted input optical signal output from the second polarization separating and coupling device to said passive mode-locked semiconductor laser diode.

13. The optical clock signal extracting device according to claim 5,
wherein said input portion is provided with
a first polarization separating and coupling device separating an input optical signal into a first input optical signal and a second input optical signal,
an optical attenuator which adjusts the strength of said first input optical signal and outputs the optical signal as a first adjusted input optical signal,
a second polarization separating and coupling device which couples said first adjusted input optical signal output from said optical attenuator and said second input optical signal for output as an adjusted input optical signal,
a first optical isolator which inputs an adjusted input optical signal output from said second polarization separating and coupling device and prevents returning light from being input to an optical transmission line transmitting said input optical signal, and
a first coupling optical system which outputs said adjusted input optical signal to said passive mode-locked semiconductor laser diode.

14. The optical clock signal extracting device according to claim 5,
wherein said input portion is provided with
a first polarization separating and coupling device separating an input optical signal into a first input optical signal and a second input optical signal,
an optical amplifier which amplifies the strength of said second input optical signal for output as a second adjusted input optical signal,
a second polarization separating and coupling device which couples said second adjusted input optical signal output from said optical amplifier and said first input optical signal for output as an adjusted input optical signal,
a first optical isolator which inputs said adjusted input optical signal output from said second polarization separating and coupling device and prevents returning light from being input to an optical transmission line transmitting said input optical signal, and
a first coupling optical system which outputs said adjusted input optical signal to said passive mode-locked semiconductor laser diode.

15. A method for extracting an optical clock signal by which the optical clock signal is extracted by the optical clock signal extracting device according to claim 5,
wherein said passive mode-locked semiconductor laser diode is driven in a state in which any of longitudinal-mode oscillation wavelengths of said extracted optical clock signal are not in accordance with a peak wavelength in the frequency spectrum of an input optical signal.

* * * * *